US012641808B2

(12) United States Patent
Imai

(10) Patent No.: US 12,641,808 B2
(45) Date of Patent: May 26, 2026

(54) SEMICONDUCTOR DEVICE INCLUDING INSULATED GATE BIPOLAR TRANSISTOR WITH CONTACT HOLE IN INTERLAYER INSULATING FILM AND METHOD OF MANUFACTURING THE SAME

(71) Applicant: RENESAS ELECTRONICS CORPORATION, Tokyo (JP)

(72) Inventor: Tomohiro Imai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 726 days.

(21) Appl. No.: 17/958,787

(22) Filed: Oct. 3, 2022

(65) Prior Publication Data

US 2023/0178639 A1     Jun. 8, 2023

(30) Foreign Application Priority Data

Dec. 3, 2021     (JP) .................................. 2021-197292

(51) Int. Cl.
*H10D 12/00*          (2025.01)
*H01L 21/768*         (2006.01)
(Continued)

(52) U.S. Cl.
CPC ......... *H10D 12/421* (2025.01); *H10D 12/481* (2025.01); *H10D 62/60* (2025.01); *H10W 20/069* (2026.01)

(58) Field of Classification Search
CPC ......... H01L 21/76897; H01L 21/76805; H01L 21/28238; H10D 12/421; H10D 12/038; H10D 12/00; H10D 12/01; H10D 84/80
See application file for complete search history.

(56) References Cited

U.S. PATENT DOCUMENTS 6,872,653 B2     3/2005  Fujii
8,809,911 B2     8/2014  Yoshikawa
                 (Continued)

FOREIGN PATENT DOCUMENTS

JP     2003-318395  A     11/2003
JP     2008-177279  A      7/2008
                 (Continued)

OTHER PUBLICATIONS

Office Action dated Feb. 4, 2025, issued in corresponding Japanese patent application No. 2021-197292, 12 pages.
(Continued)

*Primary Examiner* — Davienne N Monbleau
*Assistant Examiner* — Heim Kirin Grewal
(74) *Attorney, Agent, or Firm* — Rimon P.C.

(57) ABSTRACT

An interlayer insulating film includes a first insulating film formed on a semiconductor layer and a second insulating film formed on the first insulating film. The first insulating film is a silicon oxide film and the second insulating film is a BPSG film. A thickness of the second insulating film is larger than a thickness of the first insulating film. A contact hole is formed of a first contact hole and a second contact hole. The first contact hole penetrates an emitter region and reaches a base region. The second contact hole is formed in the first insulating film and the second insulating film and communicates with the first contact hole. An opening width of the second contact hole is larger than an opening width of the first contact hole.

7 Claims, 19 Drawing Sheets

(51) Int. Cl.
    *H10D 62/60*        (2025.01)
    *H10W 20/00*      (2026.01)

(56)            References Cited

U.S. PATENT DOCUMENTS

| | | | |
|---|---|---|---|
| 9,041,050 B2 | 5/2015 | Matsuura | |
| 9,634,095 B2 | 4/2017 | Oosawa et al. | |
| 9,847,410 B2 | 12/2017 | Matsuura | |
| 11,929,365 B2 | 3/2024 | Umeki | |
| 2003/0199156 A1* | 10/2003 | Fujii | H01L 21/76855 |
| | | | 438/618 |
| 2009/0014754 A1* | 1/2009 | Yoshikawa | H10D 12/038 |
| | | | 257/E29.198 |
| 2017/0301763 A1* | 10/2017 | Feil | H10D 30/0297 |
| 2020/0273971 A1* | 8/2020 | Ishikawa | H10D 62/106 |
| 2021/0384190 A1* | 12/2021 | Umeki | H10D 84/617 |

FOREIGN PATENT DOCUMENTS

| | | | |
|---|---|---|---|
| JP | 2011-171632 | A | 9/2011 |
| JP | 2013-140885 | A | 7/2013 |
| JP | 2014-158013 | A | 8/2014 |
| JP | 2016-225566 | A | 12/2016 |
| WO | 2012-073609 | A1 | 6/2012 |
| WO | 2020-080476 | A1 | 4/2020 |

OTHER PUBLICATIONS

Office Action dated Dec. 13, 2025, issued in corresponding German patent application No. 10 2022 212 657.2.

Ahmed et al. "Chemical vapour deposition (CVD) of borophosphosilicate glass films", J Mater Sci: Mater Electron 7, 127-131 (1996).

* cited by examiner

SEMICONDUCTOR DEVICE INCLUDING INSULATED GATE BIPOLAR TRANSISTOR WITH CONTACT HOLE IN INTERLAYER INSULATING FILM AND METHOD OF MANUFACTURING THE SAME

CROSS-REFERENCE TO RELATED APPLICATIONS

The disclosure of Japanese Patent Application No. 2021-197292 filed on Dec. 3, 2021 including the specification, drawings and abstract is incorporated herein by reference in its entirety.

BACKGROUND

The present invention relates to a semiconductor device and a method of manufacturing the same, and particularly relates to a semiconductor device having a contact hole formed in an interlayer insulating film and a method of manufacturing the same.

As an IGBT (Insulated Gate Bipolar Transistor) having a low on-resistance, a trench-gate IGBT has been widely used.

There are disclosed techniques listed below.

[Patent Document 1] Japanese Unexamined Patent Application Publication No. 2013-140885

[Patent Document 2] Japanese Unexamined Patent Application Publication No. 2016-225566

For example, Patent Document 1 discloses an IGBT having a GGEE structure. In such an IGBT, in an active cell, a pair of trenches are formed in an n-type semiconductor layer, a gate electrode is buried inside the pair of trenches, and an n-type emitter region is formed in a p-type base region located between the pair of trenches. Also, in an inactive cell, the emitter region is not formed in the base region located between the pair of trenches. Also, a gate potential is supplied to the gate electrode of the active cell, and an emitter potential is supplied to the gate electrode of the inactive cell.

Patent Document 2 discloses an IGBT having a GGEE structure similar to that of Patent Document 1. An interlayer insulating film is formed on a semiconductor layer, and a contact hole penetrating the interlayer insulating film and an emitter region is formed. Also, the interlayer insulating film is formed of a stacked film of a silicon oxide film formed by the thermal oxidation method or the CVD (Chemical Vapor Deposition) method and a silicon oxide film such as a PSG (Phospho Silicate Glass) film, a BPSG (Boro Phospho Silicate Glass) film, an NSG (Non-doped Silicate Glass) film, or an SOG (Spin On Glass) film.

SUMMARY

When a thick interlayer insulating film is to be formed, a PSG film and an SOC film are stacked in many cases. However, in a fabrication facility intended for a general CMOS process, an apparatus for forming an SOG film is not introduced in many cases. It has been found that the following problems arise if an interlayer insulating film is formed only of a PSG film without using an SOG film.

For example, after forming a contact hole in an interlayer insulating film, the inside of the contact hole is filled with a plug mainly made of a tungsten film. Since the tungsten film is deposited not only inside the contact hole but also on the interlayer insulating film, it is necessary to remove the tungsten film on the interlayer insulating film. At that time, there is a problem that a part of the tungsten film is likely to remain as a residue if the upper surface of the interlayer insulating film is not flat.

Further, in the case where a semiconductor device has a region for forming other semiconductor elements such as diodes in addition to the region for forming an IGBT, the thickness of the interlayer insulating film differs in each region if the upper surface of the interlayer insulating film is not flat. Therefore, since it is necessary to individually form contact holes for each region, there is a problem that the number of masks increases and the manufacturing cost increases.

It is also conceivable that the upper surface of the interlayer insulating film is planarized by the polishing process using the CMP method, but such a polishing process is a relatively expensive process, and there is also a demand for suppressing the manufacturing cost without using the polishing process as much as possible.

A main object of this application is to improve the reliability of a semiconductor device by ensuring the flatness of the upper surface of a thick interlayer insulating film and suppressing residues such as a tungsten film. Another object of this application is to suppress the increase in manufacturing cost. Still another object of this application is to provide a relatively versatile manufacturing method that can be easily implemented in various fabrication facilities.

Other problems and novel features will be apparent from the description of this specification and accompanying drawings.

An outline of a typical embodiment disclosed in this application will be briefly described as follows.

A semiconductor device according to an embodiment includes: a semiconductor substrate having a semiconductor layer of a first conductivity type; a first impurity region of a second conductivity type opposite to the first conductivity type formed in the semiconductor layer; a second impurity region of the first conductivity type formed in the first impurity region; a trench penetrating the first impurity region and the second impurity region and reaching the semiconductor layer; a gate insulating film formed inside the trench; a gate electrode formed on the gate insulating film so as to fill an inside of the trench; an interlayer insulating film formed on the semiconductor layer; a contact hole penetrating the interlayer insulating film and the second impurity region and reaching the first impurity region; and a plug filling an inside of the contact hole and electrically connected to the first impurity region and the second impurity region. Here, the interlayer insulating film includes a first insulating film formed on the semiconductor layer and a second insulating film formed on the first insulating film, the first insulating film is a silicon oxide film, the second insulating film is a BPSG film, a thickness of the second insulating film is larger than a thickness of the first insulating film, the contact hole is formed of a first contact hole penetrating the second impurity region and reaching the first impurity region and a second contact hole formed in the first insulating film and the second insulating film and communicating with the first contact hole, and an opening width of the second contact hole is larger than an opening width of the first contact hole.

A method of manufacturing a semiconductor device according to an embodiment includes: (a) preparing a semiconductor substrate having a semiconductor layer of a first conductivity type; (b) forming a trench in the semiconductor layer; (c) forming a gate insulating film inside the trench; (d) forming a gate electrode on the gate insulating film so as to fill an inside of the trench; (e) forming a first insulating film on the semiconductor layer; (f) forming a first impurity region of a second conductivity type opposite to the first conductivity type in the semiconductor layer; (g) forming a second impurity region of the first conductivity type in the first impurity region; (h) forming a second insulating film having a thickness larger than a thickness of the first insulating film on the first insulating film, thereby forming an interlayer insulating film including the second insulating film and the first insulating film on the semiconductor layer; (i) forming a contact hole penetrating the interlayer insulating film and the second impurity region and reaching the first impurity region; and (j) forming a plug electrically connected to the first impurity region and the second impurity region so as to fill an inside of the contact hole. Here, the first insulating film is a silicon oxide film, and the second insulating film is a BPSG film. Also, the (i) includes: (i1) forming a first contact hole in the second insulating film, the first insulating film, the second impurity region, and the first impurity region; and (i2) after the (i1), performing isotropic etching process to the second insulating film and the first insulating film, thereby forming, in the second insulating film and the first insulating film, a second contact hole having an opening width larger than an opening width of the first contact hole and communicating with the first contact hole.

According to the embodiment, it is possible to improve the performance of a semiconductor device. Also, according to the embodiment, it is possible to suppress the increase in manufacturing cost.

DETAILED DESCRIPTION

Figure 1:
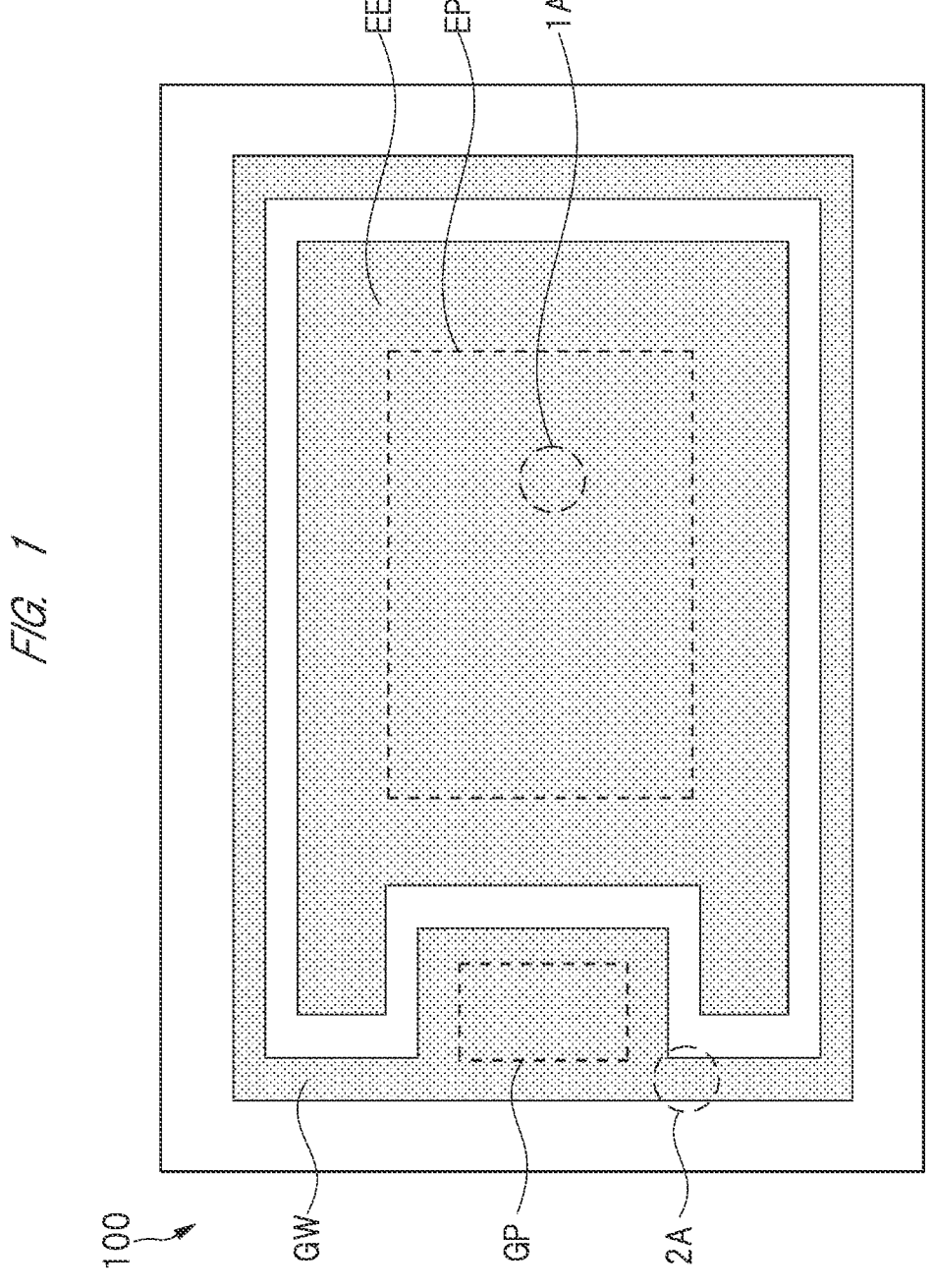
FIG. 1 is a plan view showing a semiconductor device according to the first embodiment.

Hereinafter, embodiments will be described in detail with reference to drawings. In all the drawings for describing the embodiments, the members having the same function are denoted by the same reference characters and the repetitive description thereof is omitted. Also, in the following embodiments, the description of the same or similar components is not repeated in principle unless particularly required.

First Embodiment

<Structure of Semiconductor Device>

A semiconductor device 100 according to the first embodiment will be described below with reference to FIG. 1 to FIG. 3. FIG. 1 is a plan view showing a semiconductor chip which is the semiconductor device 100.

As shown in FIG. 1, most of the semiconductor device 100 is covered with an emitter electrode EE. A gate wiring GW is formed around the emitter electrode EE. A region surrounded by a broken line in the emitter electrode EE is an emitter pad EP, and a region surrounded by a broken line in the gate wiring GW is a gate pad GP. A part of each of the emitter electrode EE and the gate wiring GW is covered with a protective film (not shown). The regions exposed from the protective film serve as the emitter pad EP and the gate pad GP. Wire bonding or an external connection terminal such as a clip (copper plate) is connected to the emitter pad EP and the gate pad GP, so that the semiconductor device 100 is electrically connected to other semiconductor chips or wiring boards.

Figure 2:
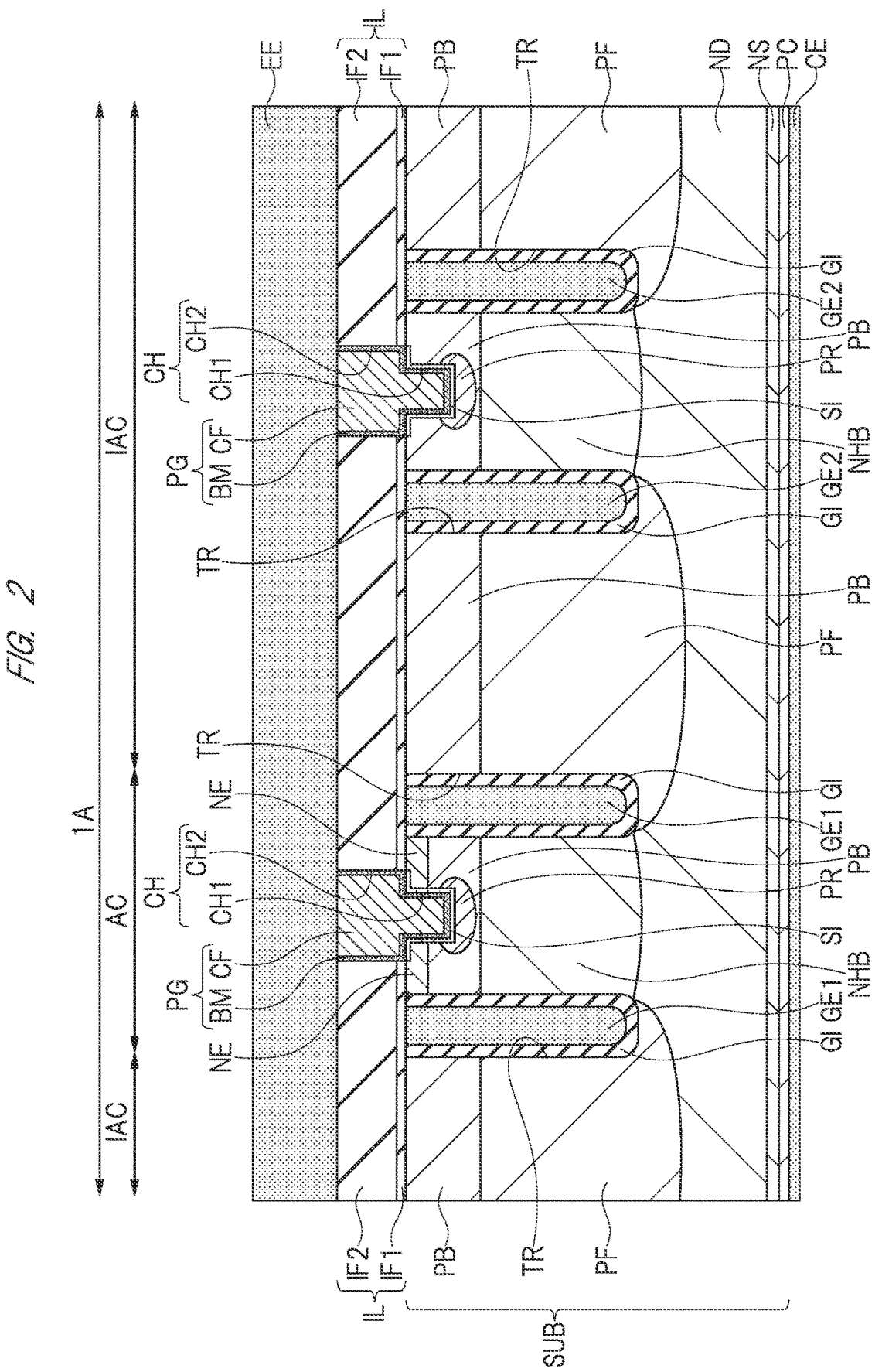
FIG. 2 is a cross-sectional view showing the semiconductor device according to the first embodiment.

FIG. 2 is a cross-sectional view showing the principal part corresponding to the region 1A in FIG. 1. The region 1A is a cell region in which the IGBT is formed. The IGBT shown in FIG. 2 is an IGBT having a GGEE structure and is an IE-IGBT capable of using IE (Injection Enhancement) effect.

The IE effect is a technique for increasing the concentration of charges accumulated in a semiconductor layer ND by making it difficult to discharge holes from the emitter electrode EE side when the IGBT is in an ON state. Therefore, the semiconductor device 100 has an active cell region AC for performing the main operation of the IGBT and an inactive cell region IAC other than the active cell region AC. A gate electrode GE1 in the active cell region AC is electrically connected to the gate wiring GW, and a gate potential is supplied to the gate electrode GE1 during the operation of the IGBT. A gate electrode GE2 in the inactive cell region IAC is electrically connected to the emitter electrode EE, and an emitter potential is supplied to the gate electrode GE2 during the operation of the IGBT.

The semiconductor substrate SUB has a low concentration n-type semiconductor layer (drift region) ND. On the back surface side of the semiconductor substrate SUB, an n-type field stop region (impurity region) NS having an impurity concentration higher than that of the semiconductor layer ND, a p-type collector region (impurity region) PC, and a collector electrode CE made of a metal film are formed. During the operation of the IGBT, a collector potential is supplied to the collector region PC via the collector electrode CE.

Trenches TR are formed in the semiconductor layer ND on the front surface side of the semiconductor substrate SUB. The trenches TR penetrate an emitter region NE and/or a base region PB described later, and reach the semiconductor layer ND. A gate insulating film GI is formed inside the trenches TR. The gate electrodes GE1 and GE2 are formed on the gate insulating film GI so as to fill the inside of the trenches TR. The gate insulating film GI is, for example, a silicon oxide film, and the gate electrodes GE1 and GE2 are, for example, polycrystalline silicon films into which n-type impurities are introduced.

In the active cell region AC, a hole barrier region (impurity region) NHB having an impurity concentration higher than that of the semiconductor layer ND is formed in the semiconductor layer ND between the pair of gate electrodes GE1. A p-type base region (impurity region) PB is formed in the hole barrier region NHB. An n-type emitter region (impurity region) NE having an impurity concentration higher than that of the hole barrier region NHB is formed in the p-type base region PB.

In the inactive cell region IAC, a hole barrier region NHB is formed in the semiconductor layer ND between the pair of gate electrodes GE2. Also, a p-type floating region (impurity region) PF is formed in the semiconductor layer ND between the gate electrode GE1 and the gate electrode GE2. A p-type base region PB having an impurity concentration higher than that of the floating region PF is formed in the floating region PF. In order to improve high withstand voltage characteristics, the floating region PF is preferably formed to a position deeper than the bottom portion of the trench TR, and is more preferably formed so as to cover the bottom portion of the trench TR.

An interlayer insulating film IL is formed on the semiconductor layer ND. In the active cell region AC, a contact hole CH penetrates the interlayer insulating film IL and the emitter region NE, and reaches the base region PB. The contact hole CH is formed so as to be in contact with the emitter region NE and the base region PB. A plug PG fills the inside of the contact hole CH and is electrically connected to the emitter region NE and the base region PB. The configuration of the contact hole CH and the plug PG in the inactive cell region IAC is also substantially the same as that in the active cell region AC, except for the absence of the emitter region NE.

A p-type high concentration diffusion region (impurity region) PR having an impurity concentration higher than that of the base region PB is formed around the bottom portion of the contact hole CH. The high concentration diffusion region PR is provided in order to reduce the contact resistance with the plug PG and to prevent the latch-up.

The emitter electrode EE is formed on the interlayer insulating film IL1. The emitter electrode EE is electrically connected to the emitter region NE, the base region PB, and the high concentration diffusion region PR via the plug PG, and supplies an emitter potential to these regions. Although not shown here, the gate wiring GW formed in the same process as the emitter electrode EE is also formed on the interlayer insulating film IL. Such an emitter electrode EE and a gate wiring GW are made of, for example, a TiW film and an aluminum film formed on the TiW film. The aluminum film is the main conductor film of the emitter electrode EE and the gate wiring GW, and is sufficiently thicker than the TiW film.

Figure 3:
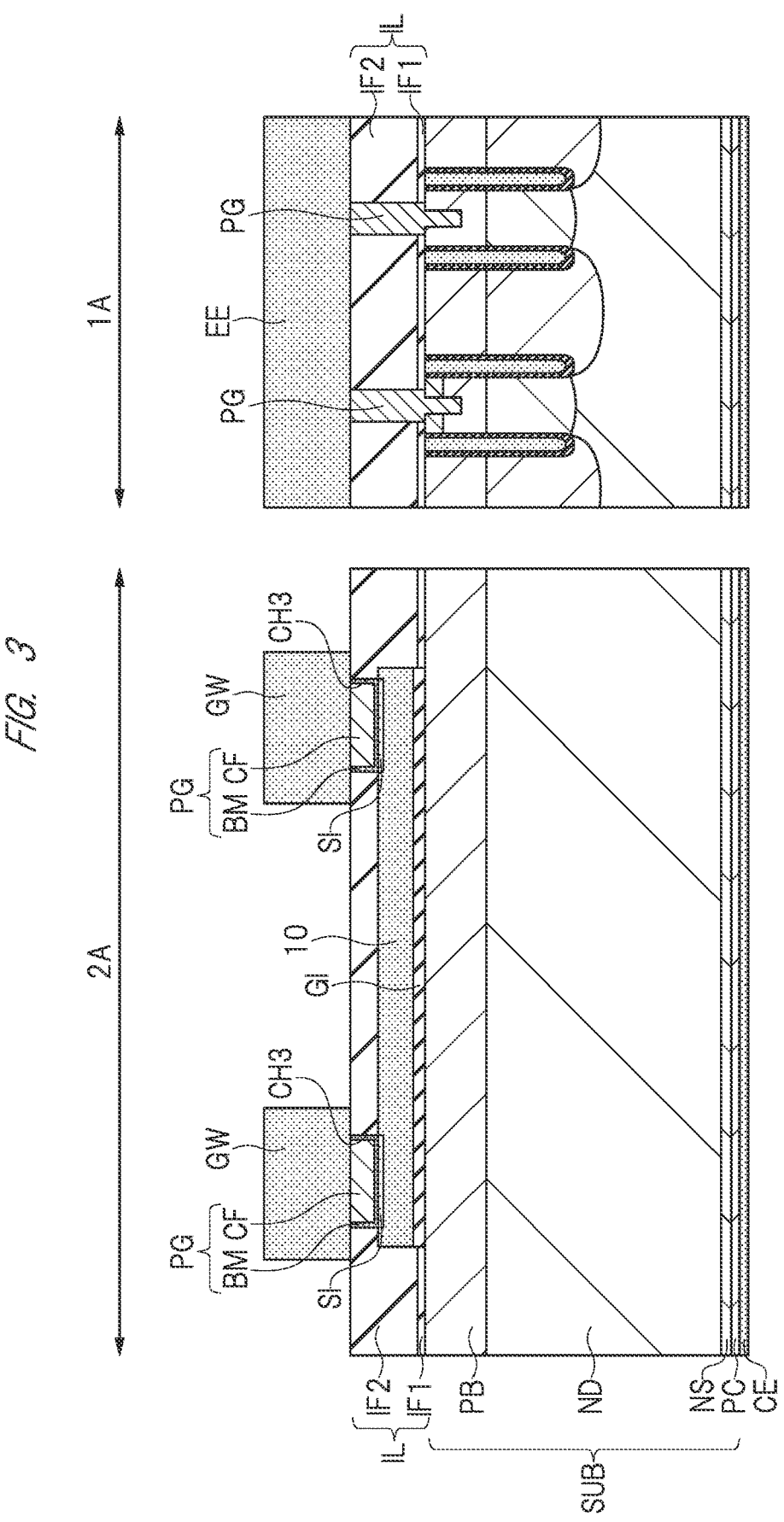
FIG. 3 is a cross-sectional view showing another region of the semiconductor device according to the first embodiment.

FIG. 3 is a cross-sectional view showing the principal part corresponding to the region 2A in FIG. 1. The region 2A is a semiconductor element formation region different from the region where the IGBT (trench TR and others) is formed in the semiconductor substrate SUB. FIG. 3 shows, for example, a resistance element 10 as a semiconductor element formed in the region 2A. The resistance element 10 is made of a conductive film formed on the semiconductor layer ND via the gate insulating film GI. Such a conductive film is made of a film in the same layer as the gate electrodes GE1 and GE2, and is made of, for example, a polycrystalline silicon film into which n-type impurities are introduced.

Although not shown in detail, not only the resistance element 10 but also other semiconductor elements such as a pn diode are formed in the region 2A. The resistance element 10 and other semiconductor elements are electrically connected to the gate wiring GW (gate pad GP) via the plug PG, and constitute a protection circuit for protecting the semiconductor device 100 from a surge voltage applied to the gate pad GP.

The interlayer insulating film IL in the first embodiment includes an insulating film IF1 formed on the semiconductor layer ND and an insulating film IF2 formed on the insulating film IF1, The insulating film IF1 is a silicon oxide film containing no impurity, and is a thermal oxide film formed by the thermal oxidation method. Even if the insulating film IF1 contains an impurity, the impurity concentration thereof is very small and is lower than the concentration of the impurity contained in the PSG film or the BPSG film. The insulating film IF2 is a silicon oxide film containing boron and phosphorus and is a BPSG film.

Phosphorus contained in the insulating film IF2 plays a role of fixing (gettering) Na ions that degrade the characteristics of the semiconductor element. Boron contained in the insulating film IF2 plays a role of lowering the melting point of the insulating film IF2, so that the insulating film IF2 is easily melted by the heat treatment. Since the softening point of the insulating film IF2 is lower than the softening point of the PSG film, the upper surface of the insulating film IF2 is planarized by performing the reflow process.

Therefore, by increasing the thickness of the insulating film IF2 such that the insulating film IF2 serves as a major part of the interlayer insulating film IL, the upper surface of the interlayer insulating film IL can be easily kept flat even if there is a difference in level between the regions of the semiconductor substrate SUB. For example, the difference in level is likely to occur between the region 2A and the region 1A shown in FIG. 3 when forming the insulating film IF2 (see FIG. 10 and FIG. 11 below).

On the other hand, when the insulating film IF1 is not provided, diffusion of phosphorus occurs from the insulating film IF2 to the semiconductor layer ND. The insulating film IF1 functions as a protective film for preventing the diffusion of phosphorus. In order to retain such a function, the thickness of the insulating film IF1 is, for example, 100 to 500 angstroms (Å). Also, the thickness of the insulating film IF2 is larger than the thickness of the insulating film IF1, and is, for example, 8000 to 10000 angstroms (Å).

The contact hole CH in the first embodiment is formed of a first contact hole CH1 and a second contact hole CH2 communicating with the first contact hole CH1. The first contact hole CH1 is formed in the semiconductor layer ND, penetrates the emitter region NE, and reaches the base region PB. The second contact hole CH2 is formed in the insulating film IF1 and the insulating film IF2.

An opening width of the second contact hole CH2 is larger than an opening width of the first contact hole CH1 by 600 angstroms (Å) or more. In other words, the second contact hole CH2 includes the first contact hole CH1 in plan view.

Therefore, since the aspect ratio is improved when forming the plug PG, the plug PG can be properly and easily buried inside the contact hole CH. Moreover, since the opening width of the second contact hole CH2 is large, the upper surface of the emitter region NE is also exposed. Therefore, inside the contact hole CH, the plug PG is in contact not only with the side surface of the emitter region NE but also with the upper surface of the emitter region NE. Accordingly, the contact resistance between the plug PG and the emitter region NE can be reduced.

The plug PG is formed of a stacked film of a barrier metal film BM and a conductive film CF. The barrier metal film is formed of, for example, a stacked film of a titanium film and a titanium nitride film formed on the titanium film. The conductive film CF is made of, for example, a tungsten film.

Inside the contact hole CH, a silicide film SI made of a metal material contained in the barrier metal film BM and silicon is formed on the upper surface and the side surface of the emitter region NE, on the base region PB, and on the high concentration diffusion region PR. More specifically, the silicide film SI is an alloy film of a titanium film contained in the barrier metal film BM and silicon constituting the emitter region NE, the base region PB, and the high concentration diffusion region PR, and is a titanium silicide film.

A problem in the conventional art is that if the upper surface of the interlayer insulating film IL is not flat when forming the plug PG, a part of the conductive film CF (tungsten film) is left as a residue. In addition, if the upper surface of the interlayer insulating film IL is not flat, the thickness of the interlayer insulating film IL differs in each region, so that it is necessary to individually form the contact holes CH for each region. Further, although it is also conceivable to planarize the upper surface of the interlayer insulating film IL by the polishing process using the CMP method, there is a problem that the manufacturing cost increases.

In contrast to these, in the first embodiment, the insulating film IF2 is thickened such that the insulating film IF2 serves as a major part of the interlayer insulating film IL. By performing the reflow process to the insulating film IF2 having a low softening point such as a BPSG film, the upper surface of the insulating film IF2 is planarized. Therefore, it is possible to solve the problem that the residue of the conductive film CF (tungsten film) is generated and the problem that the contact hole CH needs to be individually formed for each region. Therefore, it is possible to improve the reliability of the semiconductor device. Moreover, since an expensive polishing process by the CMP method is not required, the increase in manufacturing cost can be suppressed. In addition, it is possible to provide a relatively versatile manufacturing method that can be easily implemented in various fabrication facilities.

<Method of Manufacturing Semiconductor Device>

A method of manufacturing the semiconductor device 100 according to the first embodiment will be described below with reference to FIG. 4 to FIG. 15. In the following, the region 1A will be mainly described, but the region 2A will also be described as needed.

Figure 4:
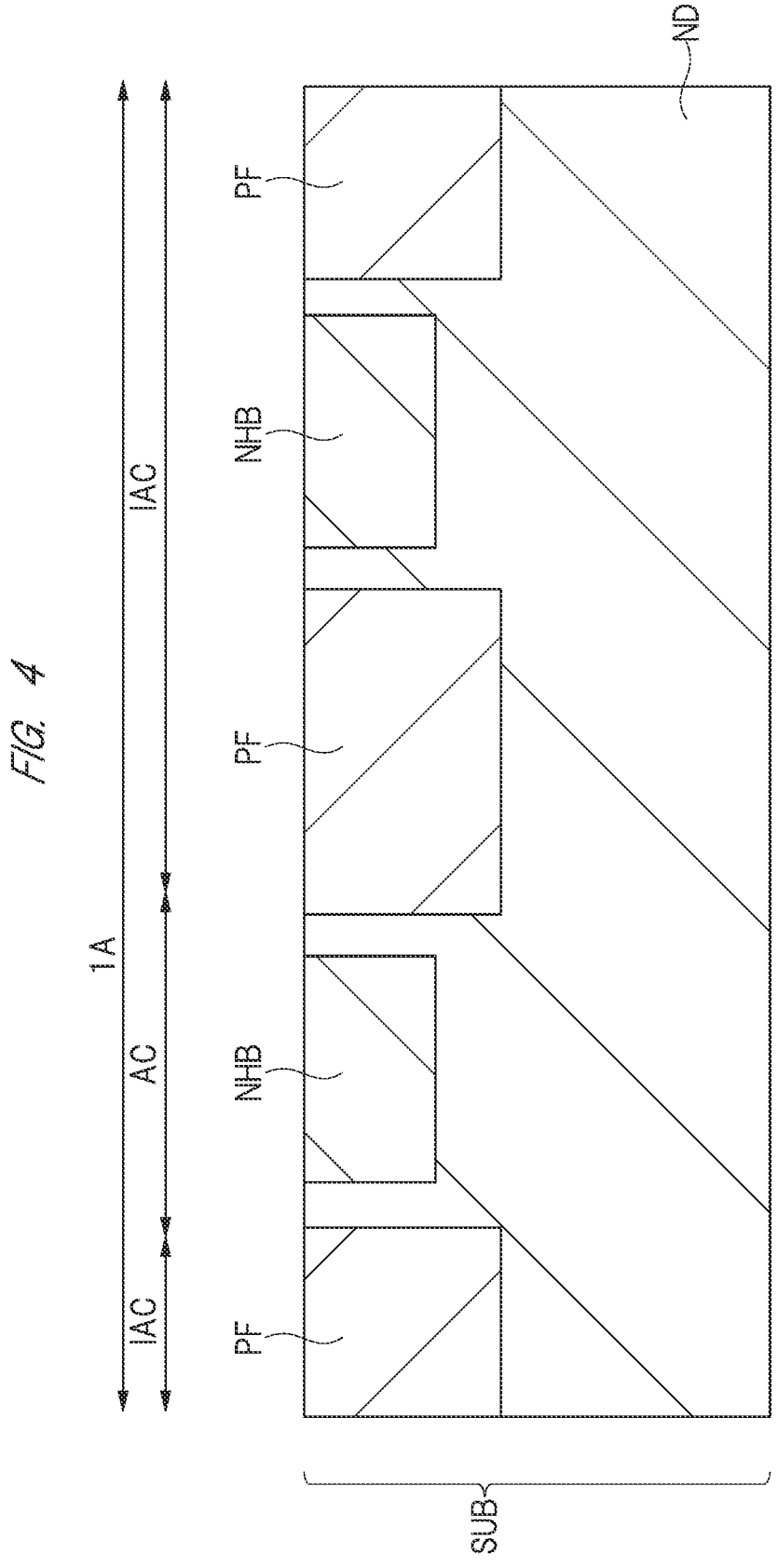
FIG. 4 is a cross-sectional view showing a manufacturing process of the semiconductor device according to the first embodiment.

As shown in FIG. 4, first, the semiconductor substrate SUB having the n-type semiconductor layer ND is prepared. The semiconductor layer ND is formed by preparing the p-type semiconductor substrate SUB and then growing an epitaxial layer on the semiconductor substrate SUB by the epitaxial growth method. Alternatively, by preparing the semiconductor substrate SUB into which n-type impurities have been introduced in advance, the n-type semiconductor substrate SUB can be used as the semiconductor layer ND. Next, the n-type hole barrier region NHB and the p-type floating region PF are formed in the semiconductor layer ND by the photolithography method and the ion implantation method.

Figure 5:
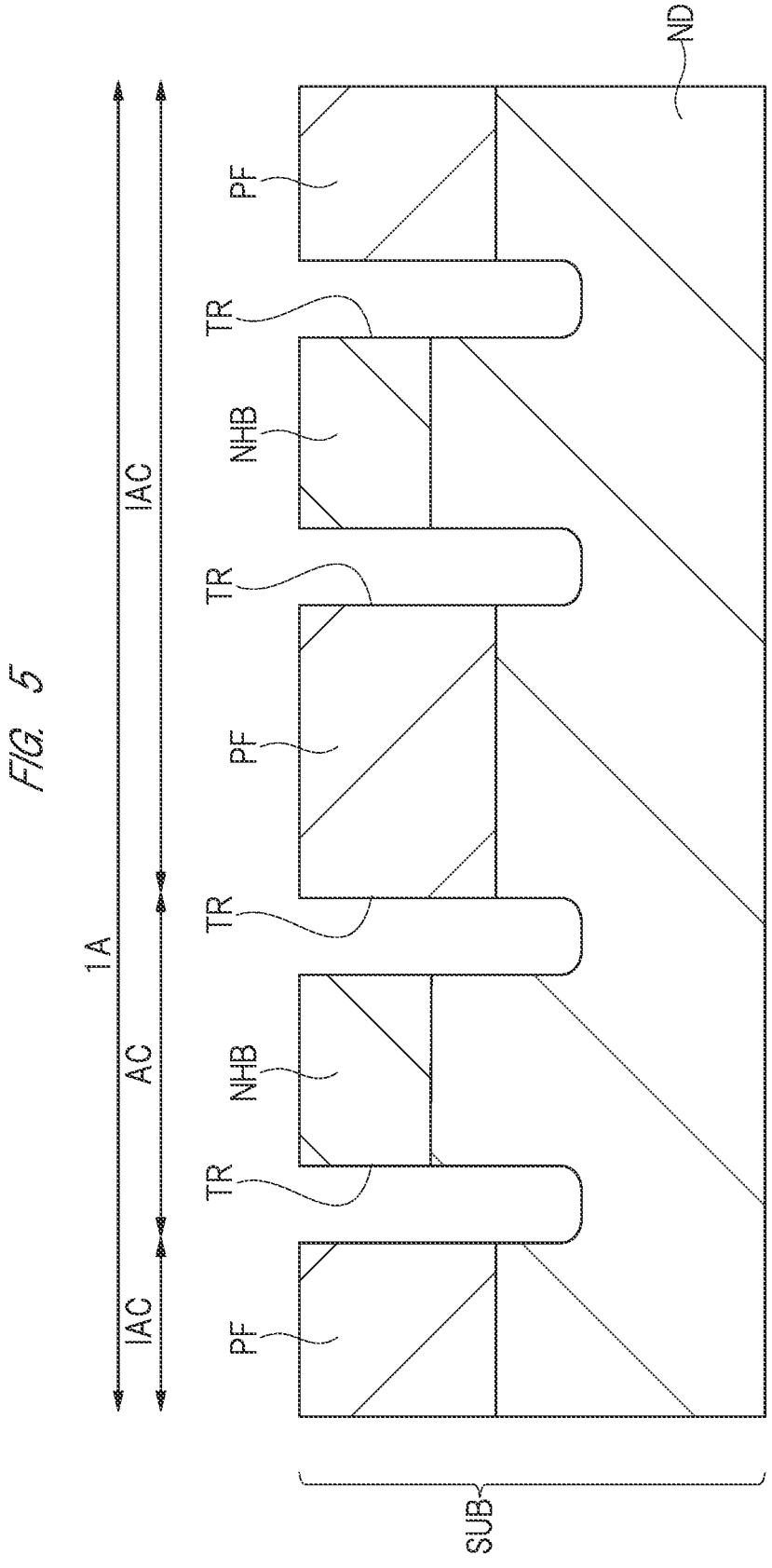
FIG. 5 is a cross-sectional view showing the manufacturing process subsequent to FIG. 4.

As shown in FIG. 5, first, an insulating film made of, for example, a silicon oxide film is formed on the semiconductor layer ND, and the insulating film is patterned by the photolithography method and the dry etching process to form a hard mask. Next, the trenches TR are formed in the semiconductor layer ND by performing the anisotropic etching process using the hard mask as a mask to the semiconductor layer ND. Thereafter, the hard mask is removed by the wet etching process or the like.

Figure 6:
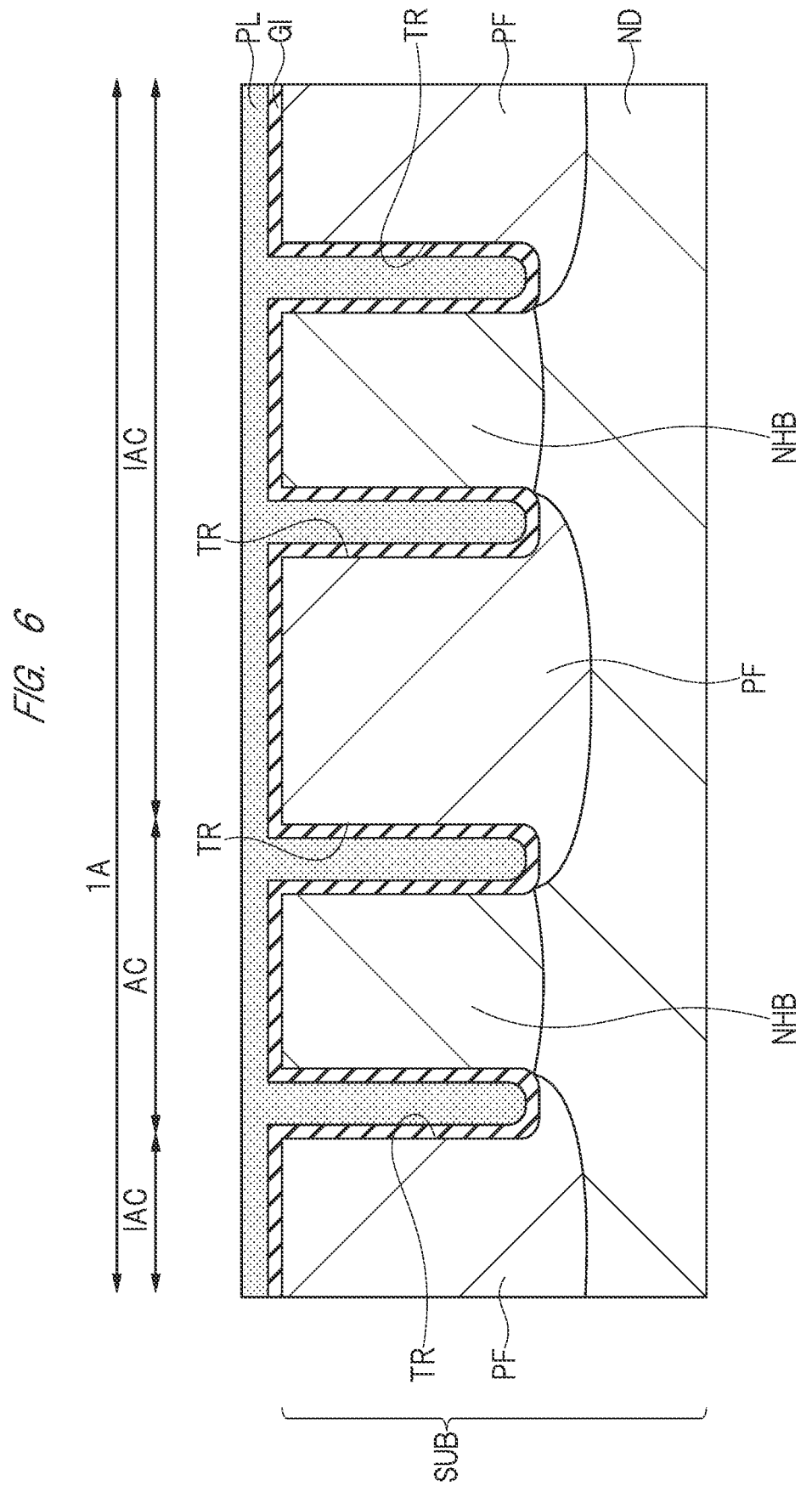
FIG. 6 is a cross-sectional view showing the manufacturing process subsequent to FIG. 5.

As shown in FIG. 6, first, by performing the heat treatment at, for example, 1000 to 1200° C. to the semiconductor substrate SUB, impurities contained in the hole barrier region NHB and the floating region PF are diffused. By this heat treatment, the hole barrier region NHB is diffused to the vicinity of the bottom portion of the trench TR, and the floating region PF is diffused to a position deeper than the bottom portion of the trench TR so as to cover the bottom portion of the trench TR.

Next, the thermal oxidation process is performed to the semiconductor layer ND to form the gate insulating film GI inside the trenches TR and on the semiconductor layer ND. Next, a conductive film PL such as a polycrystalline silicon film into which n-type impurities are introduced is formed on the gate insulating film GI by, for example, the CVD method so as to fill the inside of the trenches TR. The thickness of the gate insulating film GI is, for example, 1000 angstroms (Å).

Although not shown here, the gate insulating film GI is formed also on the semiconductor layer ND in the region 2A, and the conductive film PL is formed on the gate insulating film GI. The thickness of the conductive film PL in the region 2A is, for example, 3000 to 6000 angstroms (Å).

Figure 7:
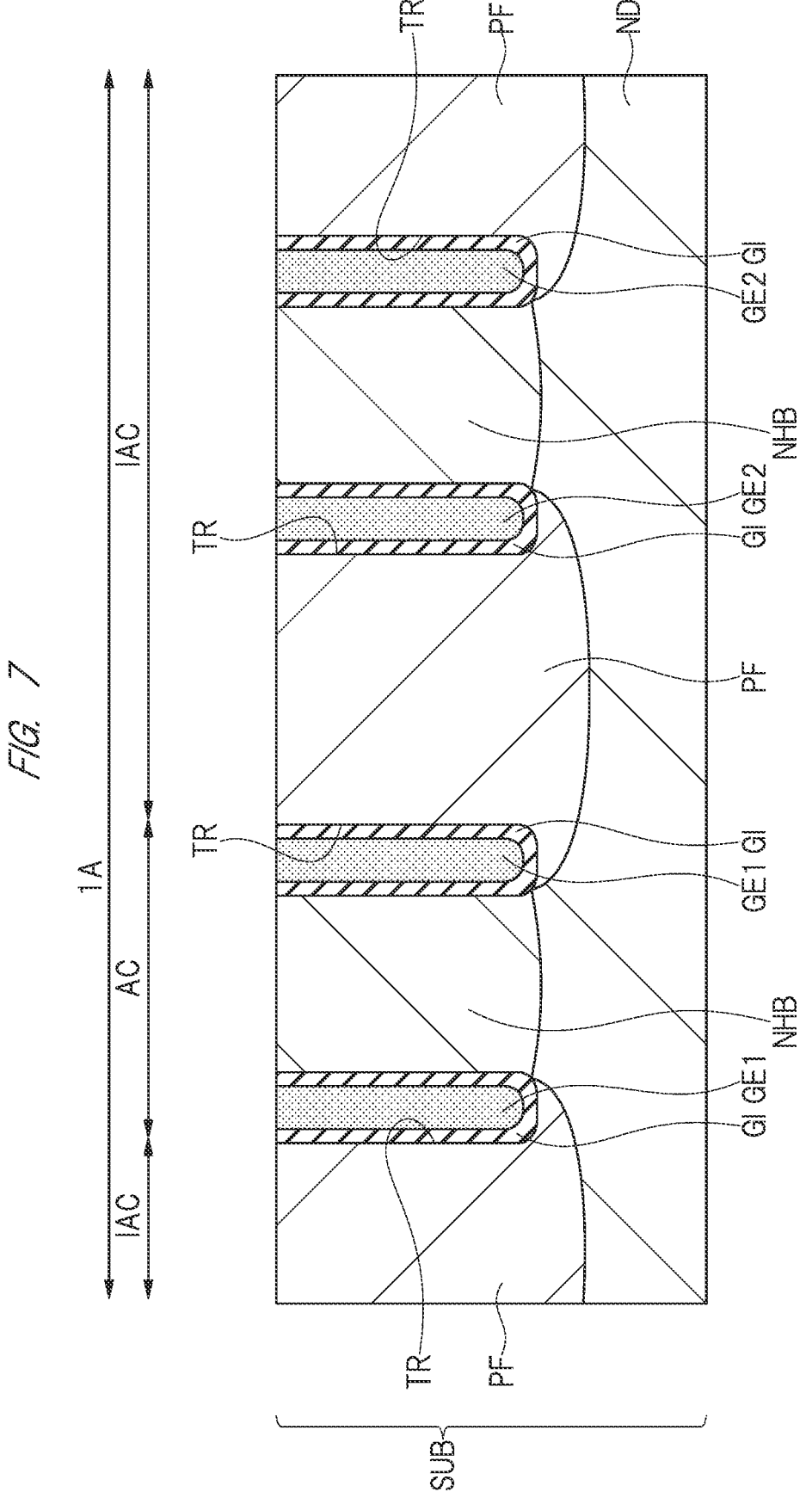
FIG. 7 is a cross-sectional view showing the manufacturing process subsequent to FIG. 6.

As shown in FIG. 7, first, the conductive film PL formed outside the trenches TR is removed by the dry etching process. The conductive film PL formed inside the trenches TR is left as the gate electrodes GE1 and GE2. Next, the gate insulating film GI formed outside the trenches TR is removed by the isotropic etching process or the anisotropic etching process.

The dry etching process of the conductive film PL is performed using a resist pattern having a pattern that opens the region 1A and partially covers the region 2A. In this way, the conductive film PL in the region 2A is patterned to form the resistance element 10 (see FIG. 10 below).

Figure 8:
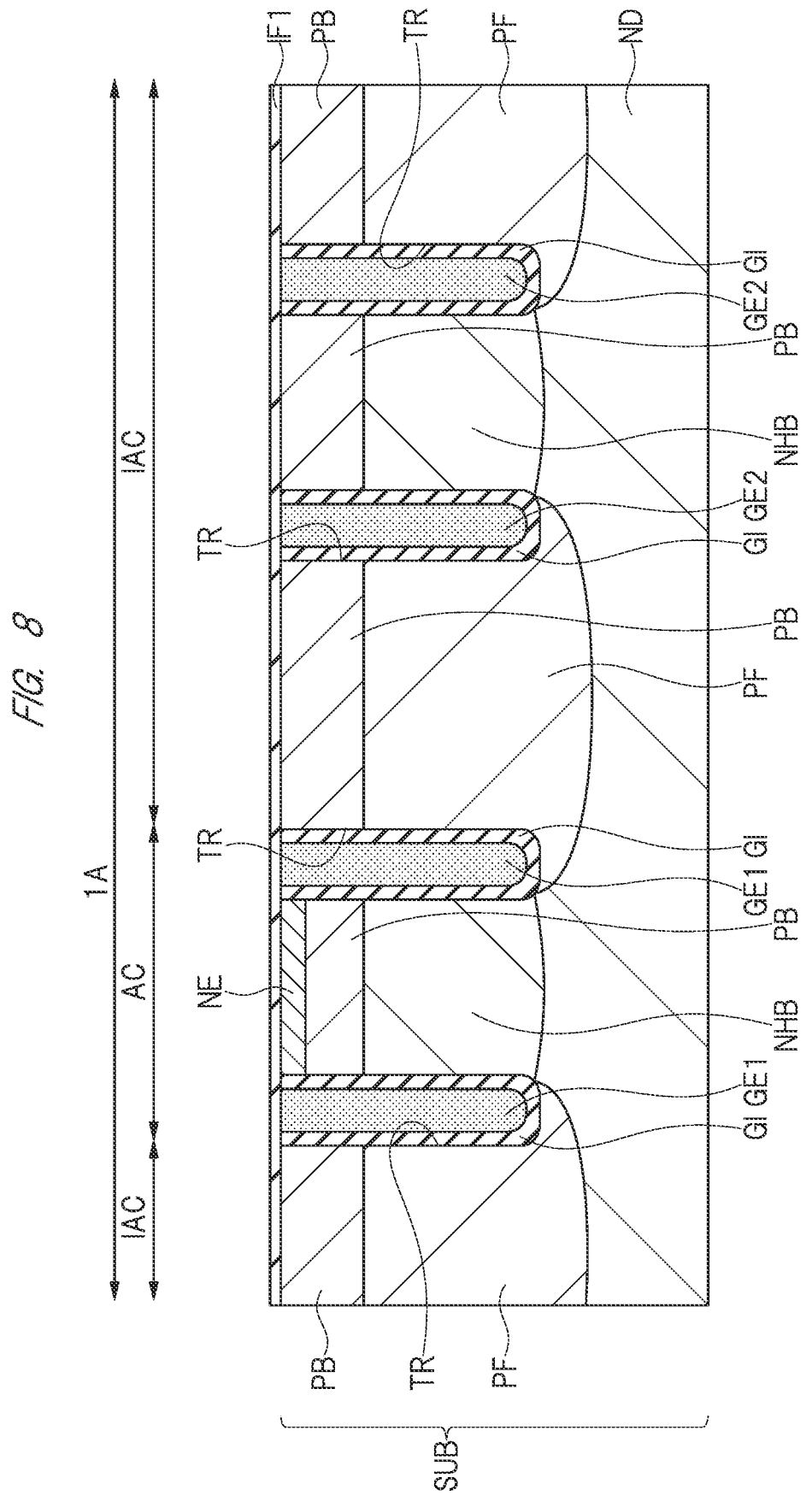
FIG. 8 is a cross-sectional view showing the manufacturing process subsequent to FIG. 7.

As shown in FIG. 8, first, the insulating film IF1 made of a thermal oxide film formed on the semiconductor layer ND by, for example, the thermal oxidation method. The thickness of the insulating film IF1 is smaller than the thickness of the gate insulating film GI, is equal to or smaller than half the thickness of the gate insulating film GI, and is, for example, 100 to 500 angstroms (Å). By removing the thick gate insulating film GI on the semiconductor layer ND and re-forming the thin insulating film IF1 on the semiconductor layer ND, it becomes easier to form the second contact hole CH2 in a later step.

Next, the p-type base region PB is formed in the semiconductor layer ND (floating region PF and hole barrier region NHB) by the photolithography method and the ion implantation method using the insulating film IF1 as a through film. Next, the n-type emitter region NE is formed on the surface of the base region PB of the active cell region AC by the photolithography method and the ion implantation method.

Note that boron is used for the ion implantation of the base region PB, and the ion implantation is performed under the conditions of an energy of 50 to 300 keV and a dose amount of $1\times10^{13}$ cm$^2$. Thereafter, for example, heat treatment is performed at 1000° C. for 100 to 200 minutes to diffuse the impurities contained in the base region PB. Also, arsenic or phosphorus or both of them is used for the ion implantation of the emitter region NE, and the ion implantation is performed under the conditions of an energy of 100 keV and a dose amount of $1\times10^{15}$ cm$^2$. Thereafter, for example, heat treatment is performed at 950° C. for 30 seconds to activate the impurities contained in each impurity region.

Figure 9:
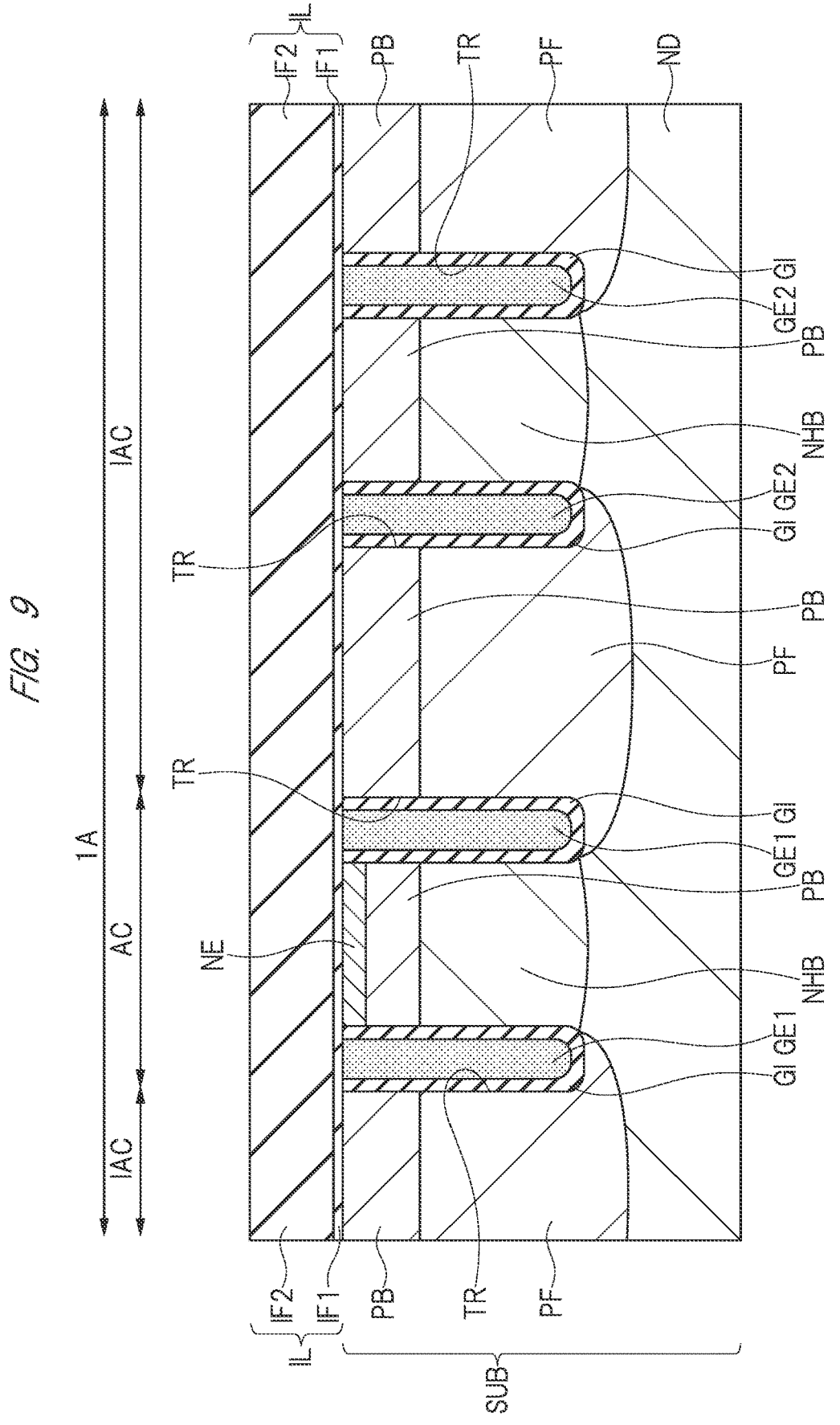
FIG. 9 is a cross-sectional view showing the manufacturing process subsequent to FIG. 8.

As shown in FIG. 9, the insulating film IF2 is formed on the insulating film IF1 by, for example, the CVD method. The insulating film IF2 is a silicon oxide film containing boron and phosphorus, and is a BPSG film. The insulating film IF1 and the insulating film IF2 each constitute a part of the interlayer insulating film IL. The thickness of the insulating film IF2 is larger than the thickness of the insulating film IF1, and is, for example, 6000 to 10000 angstroms (Å).

Next, heat treatment (reflow process) is performed the insulating film IF2 at, for example, 900 to 950° C. for 30 minutes. By this reflow process, the insulating film IF2 is softened and the upper surface of the insulating film IF2 is planarized. For example, the upper surface of the insulating film IF2 after the reflow process is more planarized than the upper surface of the insulating film IF2 before the reflow process.

Figure 10:
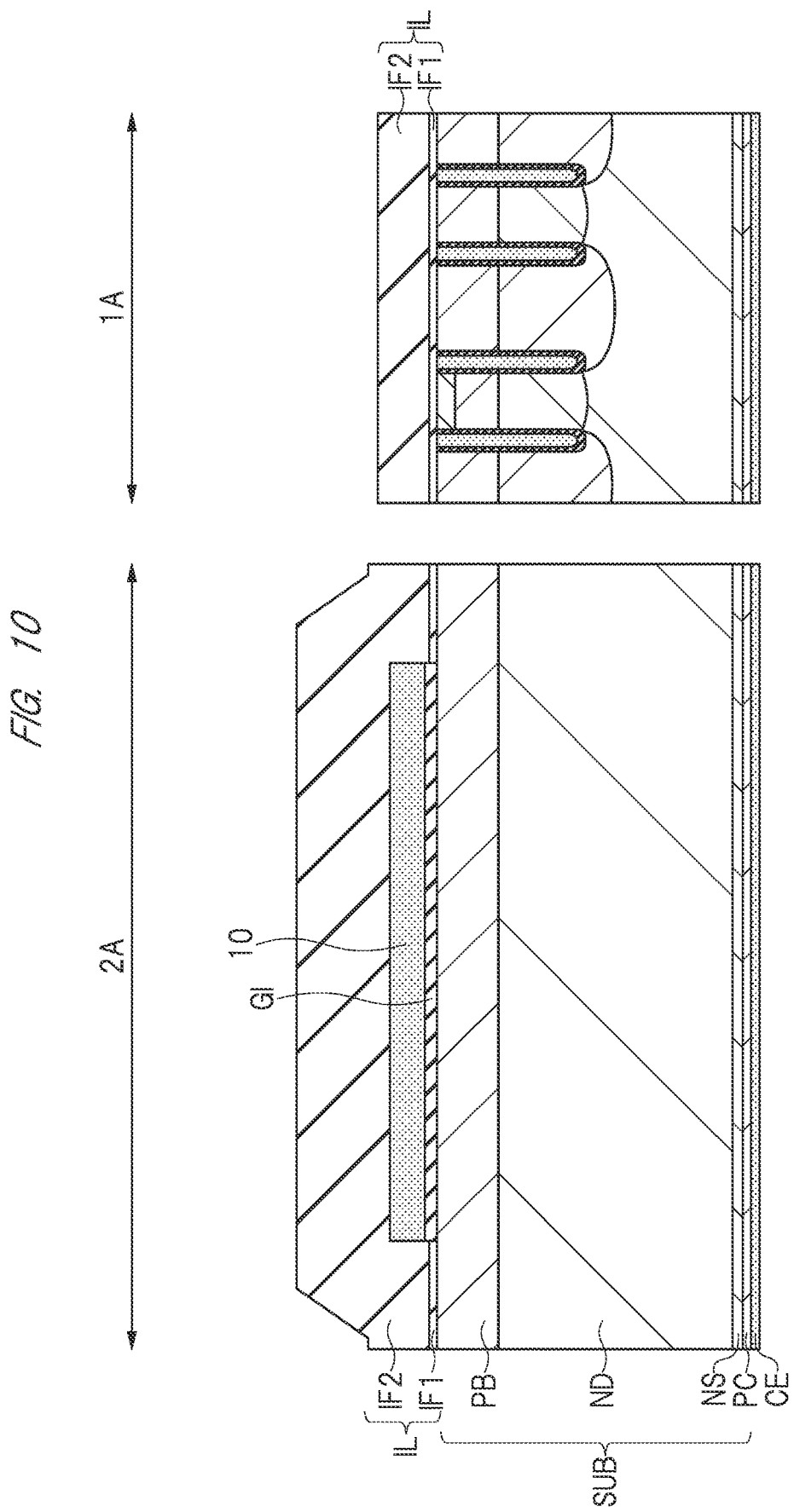
FIG. 10 is a cross-sectional view showing another region of the semiconductor device in the manufacturing process subsequent to FIG. 8.
Figure 11:
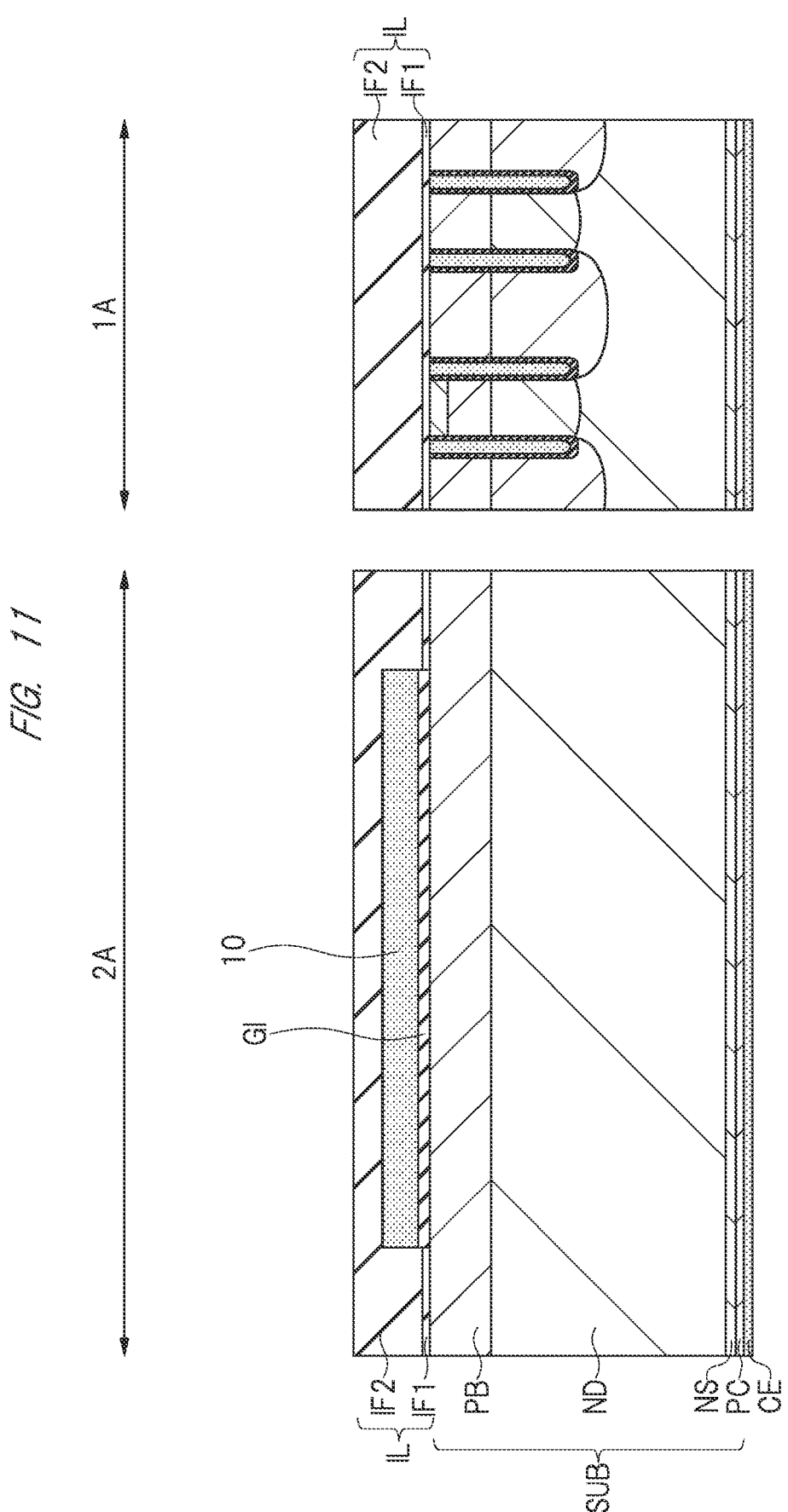
FIG. 11 is a cross-sectional view showing the manufacturing process subsequent to FIG. 10.

FIG. 10 and FIG. 11 show the state of the insulating film IF2 before and after the reflow process. As shown in FIG. 10, there is the difference in level on the upper surface of the insulating film IF2 between the region 1A and the region 2A before the reflow process. However, as shown in FIG. 11, the upper surface of the insulating film IF2 is planarized by performing the reflow process. As described above, since the expensive polishing process by the CMP method is not performed in the first embodiment, the increase in manufacturing cost can be suppressed.

Here, the resistance element 10 is formed in the region 2A, and the insulating film IF2 is formed so as to cover the resistance element 10. Since the thickness of the insulating film IF2 formed on the resistance element 10 becomes relatively small after the reflow process, it is necessary to adjust the thickness of the insulation film IF2 such that the resistance element 10 is not exposed after the reflow process. Therefore, the thickness of the insulating film IF2 formed on the resistance element 10 is preferably larger than the thickness of the resistance element 10 before the reflow process, and is preferably about twice the thickness of the resistance element 10.

Figure 12:
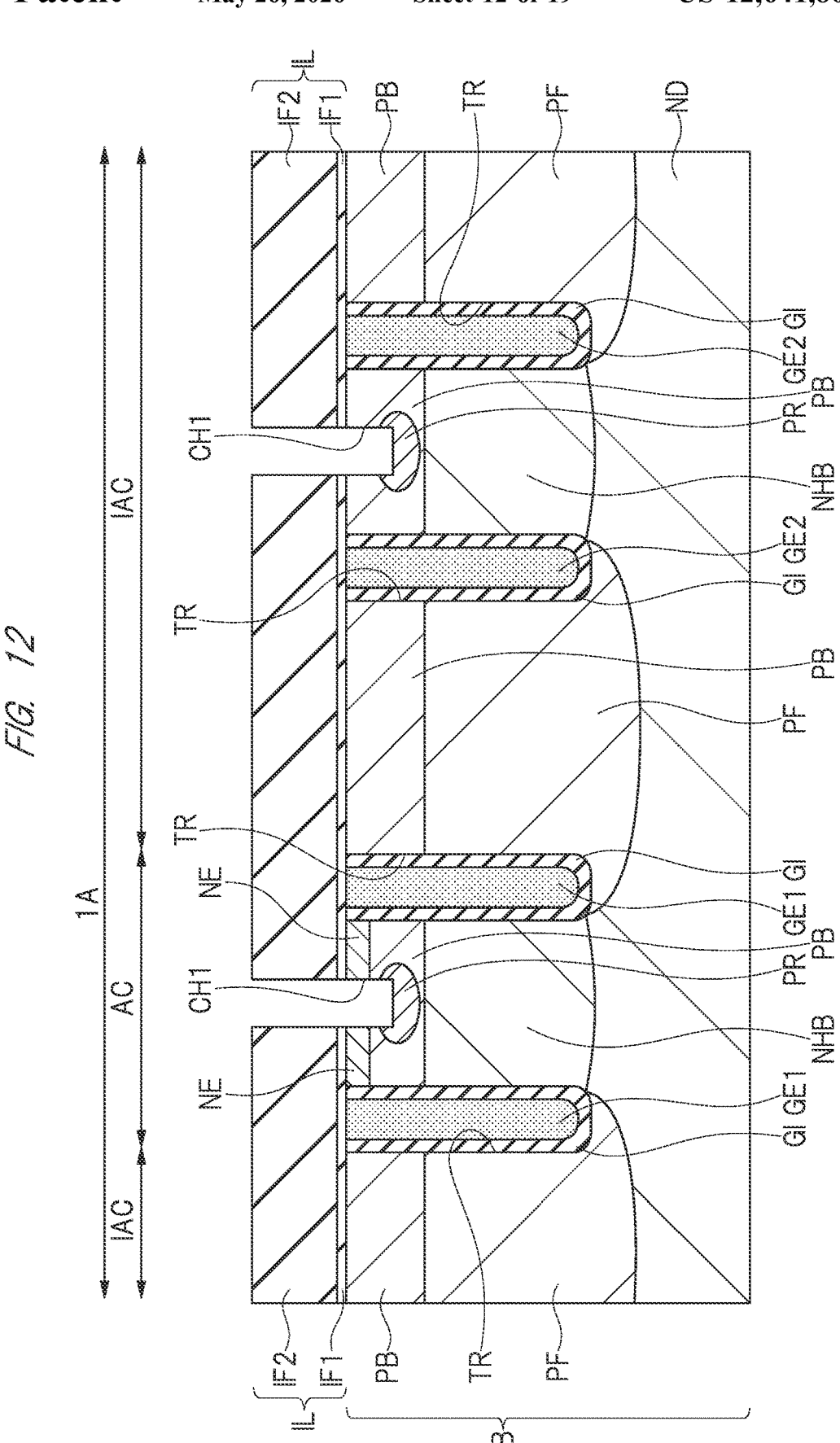
FIG. 12 is a cross-sectional view showing the manufacturing process subsequent to FIG. 9.

As shown in FIG. 12, the first contact holes CH1 are formed in the insulating film IF2, the insulating film IF1, the emitter region NE, and the base region PB by the photolithography method and the dry etching process.

Next, the p-type body region PR is formed at the bottom portion of the contact hole CH1 by the photolithography method and the ion implantation method. Thereafter, heat treatment for activating each impurity region is performed.

Boron difluoride is used for the ion implantation of the body region PR, and the ion implantation is performed under the conditions of an energy of 50 to 100 keV and a dose amount of $1\times10^{15}$ cm$^2$. Thereafter, for example, heat treatment is performed at 950° C. for 30 seconds to activate the impurities contained in each impurity region.

Figure 13:
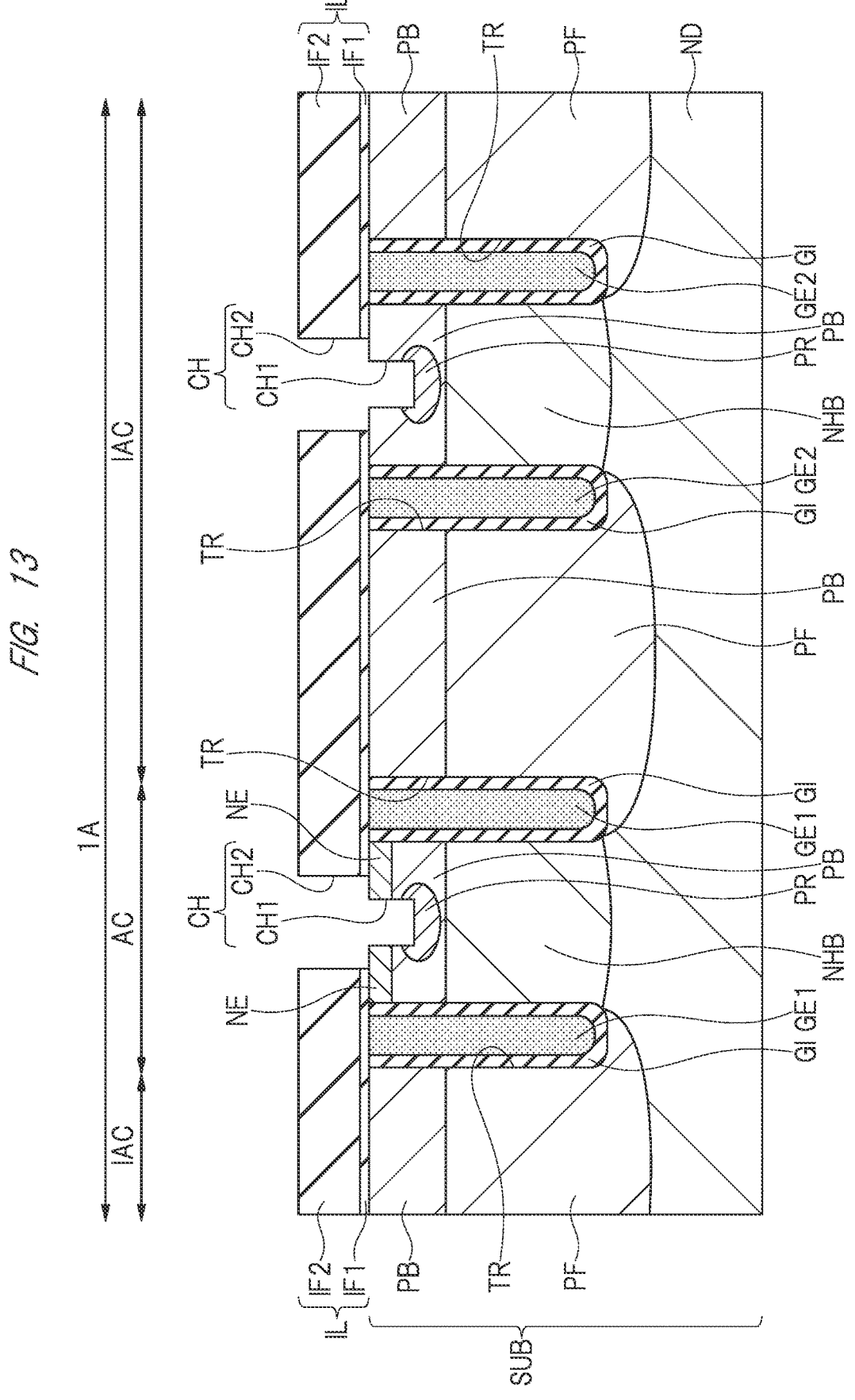
FIG. 13 is a cross-sectional view showing the manufacturing process subsequent to FIG. 12.

As shown in FIG. 13, the insulating film IF2 and the insulating film IF1 are recessed by performing the isotropic etching process to the insulating film IF2 and the insulating film IF1. For example, an aqueous solution containing hydrofluoric acid is used for this isotropic etching process. In this way, the second contact holes CH2 are formed in the insulating film IF2 and the insulating film IF1. The opening width of the second contact hole CH2 is larger than the opening width of the first contact hole CH1, and the second contact hole CH2 communicates with the first contact hole CH1.

By the steps of FIG. 12 and FIG. 13, the contact hole CH which penetrates the interlayer insulating film IL and the emitter region NE and reaches the base region PB is formed in the active cell region AC. The contact hole CH which penetrates the interlayer insulating film IL and reaches the base region PB is formed also in the inactive cell region IAC.

Note that the recessed amount of the insulating film IF2 and the insulating film IF1 by the isotropic etching process is preferably 300 angstroms (Å) or more. As a result, the opening width of the second contact hole CH2 becomes larger than the opening width of the first contact hole CH1 by 600 angstroms (Å) or more.

Incidentally, since the insulating film IF2 is a film containing boron and phosphorus, the etching rate of the insulating film IF2 in the isotropic etching process is different from the etching rate of the insulating film IF1, and is faster than the etching rate of the insulating film IF1. Therefore, if the thickness of the insulating film IF1 is too large, there is a fear that the insulating film IF remains without being removed completely and the upper surface of the emitter region NE is not exposed.

Figure 14:
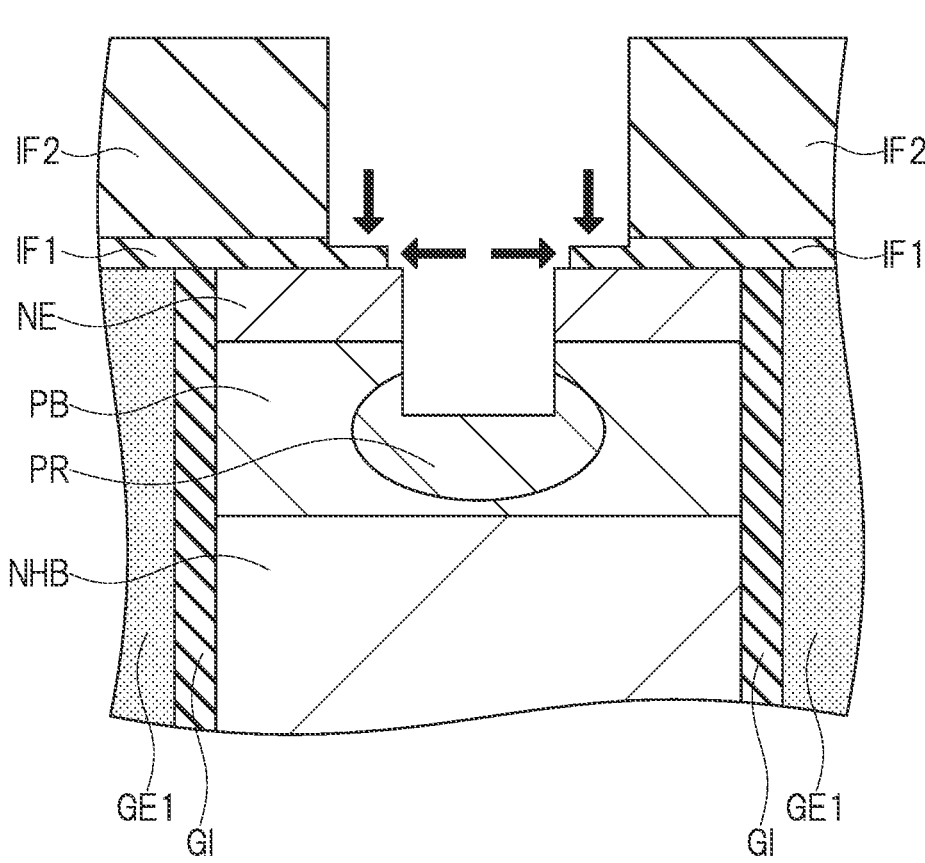
FIG. 14 is an enlarged cross-sectional view of FIG. 13.

As shown in FIG. 14, the upper surface of the insulating film IF1 is exposed as the insulating film IF2 is etched. Consequently, the insulating film IF1 is etched vertically and laterally as indicated by arrows in FIG. 14. By appropriately setting the thickness of the insulating film IF1, the insulating film IF1 can be removed by the isotropic etching process. In this way, the difference between the etching rate of the insulating film IF2 and the etching rate of the insulating film IF1 can be effectively reduced.

It is conceivable to leave the gate insulating film GI on the semiconductor layer ND outside the trench TR instead of the insulating film IF1. However, in a device driven at a high voltage such as an IGBT, the thickness of the gate insulating film GI is usually set as thick as 1000 angstroms (Å). Therefore, it becomes difficult to completely remove the gate insulating film GI outside the trench TR by the isotropic etching process. In the first embodiment, by using the insulating film IF1 having the thickness (for example, 100 to 500 angstroms (Å)) smaller than the thickness of the gate insulating film GI, the upper surface of the emitter region NE can be easily exposed when forming the second contact hole CH2.

Figure 15:
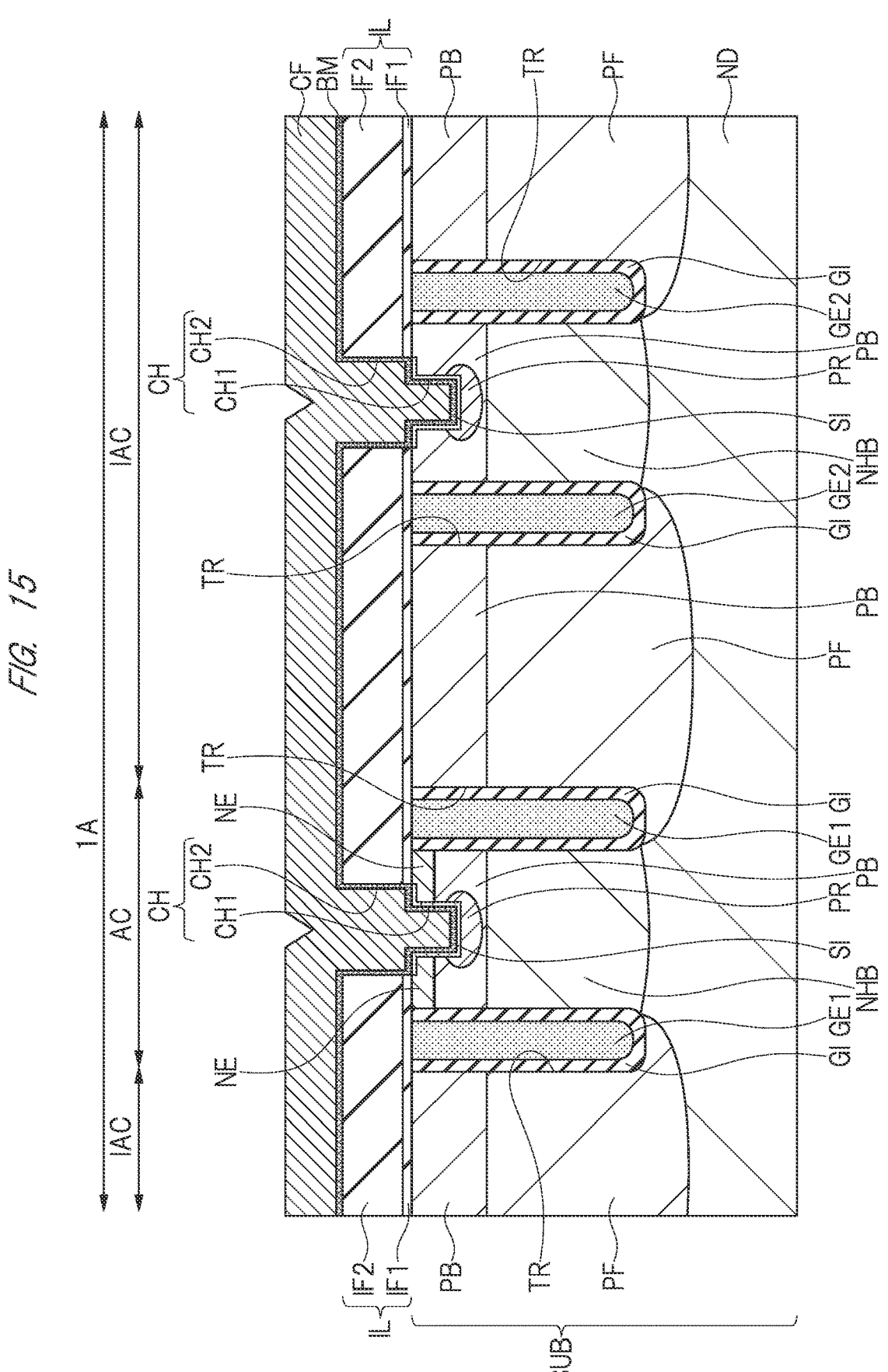
FIG. 15 is a cross-sectional view showing the manufacturing process subsequent to FIG. 13.

FIG. 15 shows the manufacturing process subsequent to FIG. 13. As shown in FIG. 15, first, the barrier metal film BM is formed inside the contact holes CH and on the interlayer insulating film IL. For example, the barrier metal film BM can be formed by forming a titanium film inside the contact holes CH and on the interlayer insulating film IL by the sputtering method and then forming a titanium nitride film on the titanium film by the sputtering method.

Next, by performing the heat treatment to the barrier metal film BM, the silicide film SI is formed on the upper surface and the side surface of the emitter region NE, on the base region PB, and on the high concentration diffusion region PR, inside the contact holes CH. The silicide film SI is an alloy film of a metal material (titanium film) contained in the barrier metal film BM and silicon, and is a titanium silicide film.

Next, the conductive film CF made of, for example, a tungsten film is formed on the barrier metal film BM by, for example, the CVD method so as to fill the inside of the contact holes CH.

Figure 16:
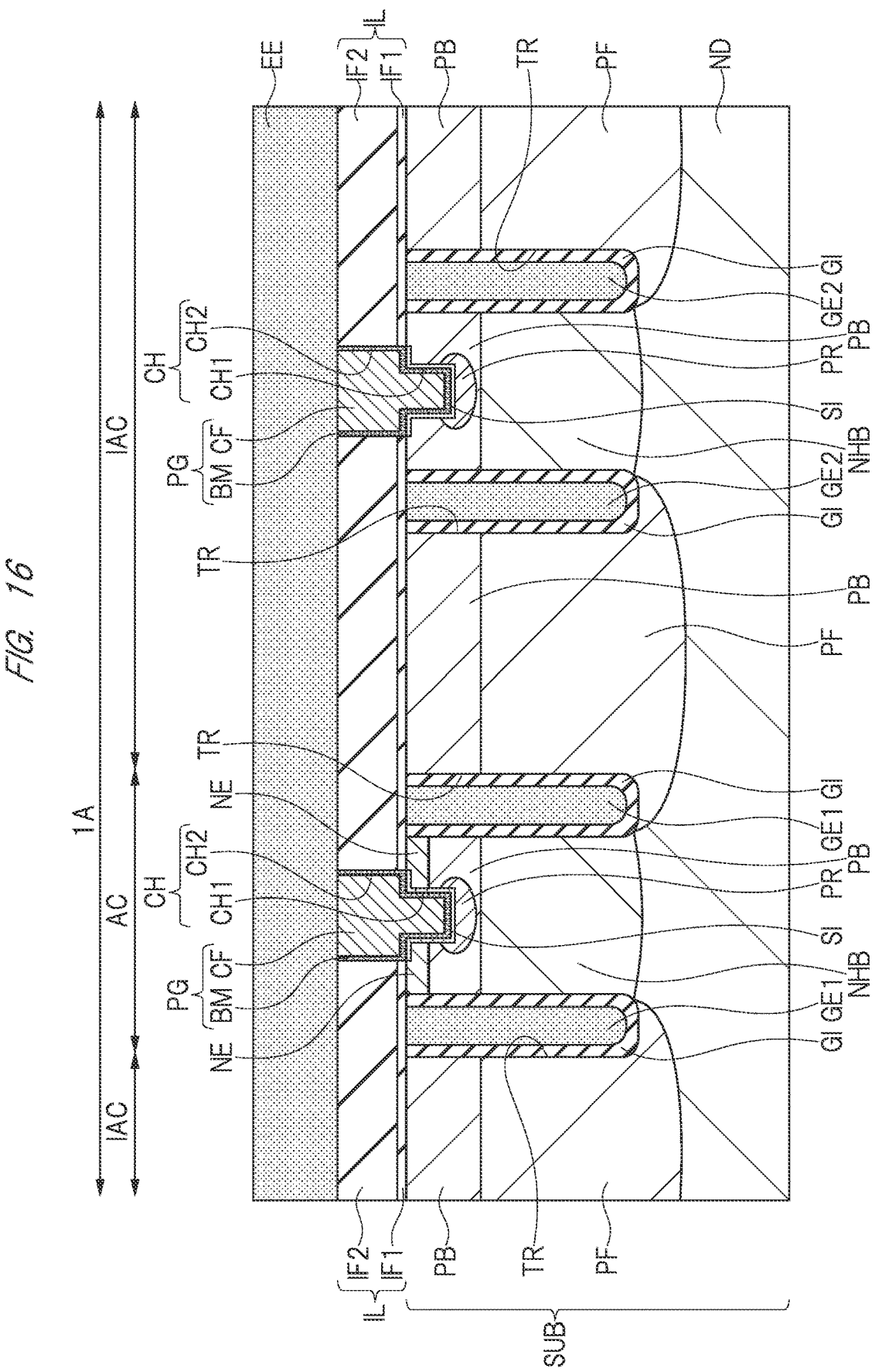
FIG. 16 is a cross-sectional view showing the manufacturing process subsequent to FIG. 14.

Then, as shown in FIG. 16, the conductive film CF and the barrier metal film BM formed outside the contact holes CH are removed by the dry etch process. In this way, the plugs PG which are embedded in the contact holes CH and electrically connected to the emitter region NE and the base region PB are formed.

Here, although the conductive film CF is formed also on the insulating film IF2, since the upper surface of the insulating film IF2 is planarized, the conductive film CF can be easily removed. Therefore, it is possible to suppress the problem that a residue of the conductive film CF is generated on the insulating film IF2.

Next, a TiW film is formed on the interlayer insulating film IL by, for example, the sputtering method, and an aluminum film is formed on the TiW film by, for example, the sputtering method. Next, the emitter electrode EE is formed by patterning the TiW film and the aluminum film by the photolithography method and the dry etching process. The emitter electrode EE is electrically connected to the emitter region NE and the base region PB via the plug PG.

Although not shown here, a contact hole for gate electrode that reaches a part of the gate electrode GE is also formed in the same steps as those in FIG. 12 and FIG. 13. Also, a plug is formed inside the contact hole for gate electrode and the gate wiring GW in the same layer as the emitter electrode EE is formed in the same steps as those in FIG. 15 and FIG. 16.

In the region 2A, a contact hole CH3 is formed on the resistance element 10 in the same steps as those in FIG. 12 and FIG. 13, and a plug PG is formed in the contact hole CH3 in the same steps as those in FIG. 15 and FIG. 16. Also, the opening width of the contact hole CH3 in the region 2A does not have to be the same as the opening width of the contact hole CH2 in the region 1A, and can be set freely.

Here, if it is attempted to simultaneously form the contact holes in the region 2A and the region 1A in the state shown in FIG. 10, since there is a difference in level on the upper surface of the insulating film IF2, defocusing is likely to occur in the development of the resist pattern for forming the contact holes. Therefore, it becomes necessary to individually form the contact holes for each region. However, such a problem does not occur in the first embodiment because the upper surface of the insulating film IF2 is planarized, and the contact holes can be simultaneously formed in the region 2A and the region 1A.

Thereafter, the field stop region NS, the collector region PC, and the collector electrode CE are formed on the back surface side of the semiconductor substrate SUB. First, the back surface of the semiconductor substrate SUB is polished to reduce the thickness of the semiconductor substrate SUB. Next, the n-type field stop region NS and the p-type collector region PC are formed by performing the ion implantation from the back surface side of the semiconductor substrate SUB. Next, on the surface of the collector region PC exposed on the back surface side of the semiconductor substrate SUB, the collector electrode CE made of a metal film such as a titanium nitride film is formed by, for example, the sputtering method.

As described above, the structure shown in FIG. 2 and FIG. 3 can be obtained, and the semiconductor device 100 according to the first embodiment is manufactured.

Second Embodiment

A semiconductor device 100 according to the second embodiment will be described below with reference to FIG. 17. In the following, differences from the first embodiment will be mainly described, and descriptions of points overlapping with the first embodiment will be omitted.

Figure 17:
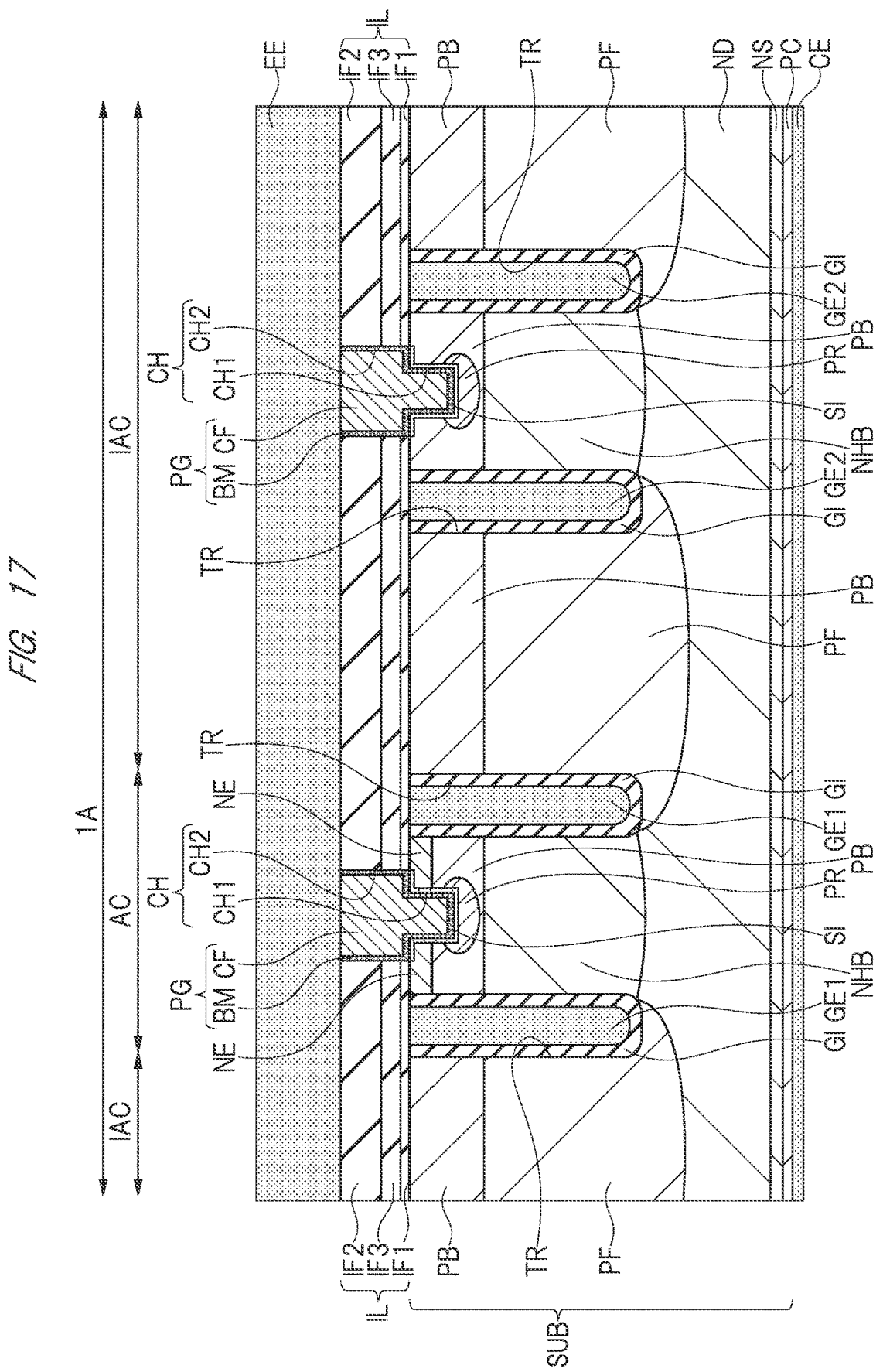
FIG. 17 is a cross-sectional view showing a semiconductor device according to the second embodiment.

As shown in FIG. 17, the interlayer insulating film IL of the second embodiment further includes an insulating film IF3 between the insulating film IF1 and the insulating film IF2. The insulating film IF3 is a silicon oxide film containing phosphorus and is a PSG film. Moreover, the insulating film IF1 of the second embodiment is a TEOS (Tetra Ethoxy Silane) film formed by the CVD method.

In the second embodiment, the thickness of the insulating film IF1 is, for example, 60 to 100 angstroms (Å), and the thickness of the insulating film IF3 is, for example, 1000 to 2000 angstroms (Å). Also, the thickness of the insulating film IF2 is larger than those of the insulating film IF1 and the insulating film IF3, and is, for example, 6000 to 8000 angstroms (Å).

In order to form such an insulating film IF3, the step of forming the insulating film IF3 is performed between the step of forming the insulating film IF1 in FIG. 8 and the step of forming the insulating film IF2 in FIG. 9. Namely, the insulating film IF3 is formed on the insulating film IF1 by, for example, the CVD method. Thereafter, the insulating film IF2 is formed on the insulating film IF3.

Further, the isotropic etching process of FIG. 13 is performed also to the insulating film IF3. Consequently, the second contact hole CH2 is formed also in the insulating film IF3.

Also in the second embodiment, the thickness of the insulating film IF2 is increased such that the insulating film IF2 serves as a major part of the interlayer insulating film IL, and the same effect as that of the first embodiment can be obtained also in the second embodiment.

Further, the insulating film IF1 is formed by the thermal oxidation method in the first embodiment. Therefore, the gate insulating film GI is likely to be re-oxidized and thickened in the vicinity of the upper portion of the trench TR. As a result, the problem that the threshold voltage varies is likely to occur. On the other hand, in the second embodiment, the insulating film IF1 is formed by the CVD method. Therefore, the second embodiment has the advantage that the above problem is less likely to occur.

On the other hand, the film quality of the CVD film is coarser than the film quality of the thermal oxide film. Accordingly, if the thickness of the insulating film IF1 is set to approximately 60 to 100 angstroms (Å), there is a possibility that the function of preventing the diffusion of phosphorus from the insulating film IF2 is not sufficiently exerted. Therefore, the diffusion of phosphorus can be prevented by forming the insulating film IF3 between the insulating film IF1 and the insulating film IF2. Since the diffusion of phosphorus from the insulating film IF3 (PSG film) is less than that from the insulating film IF2 (BPSG film), even the thin insulating film IF1 can prevent the diffusion of phosphorus from the insulating film IF3.

Third Embodiment

A semiconductor device 100 according to the third embodiment will be described below with reference to FIG. 18. In the following, differences from the first embodiment will be mainly described, and descriptions of points overlapping with the first embodiment will be omitted.

Figure 18:
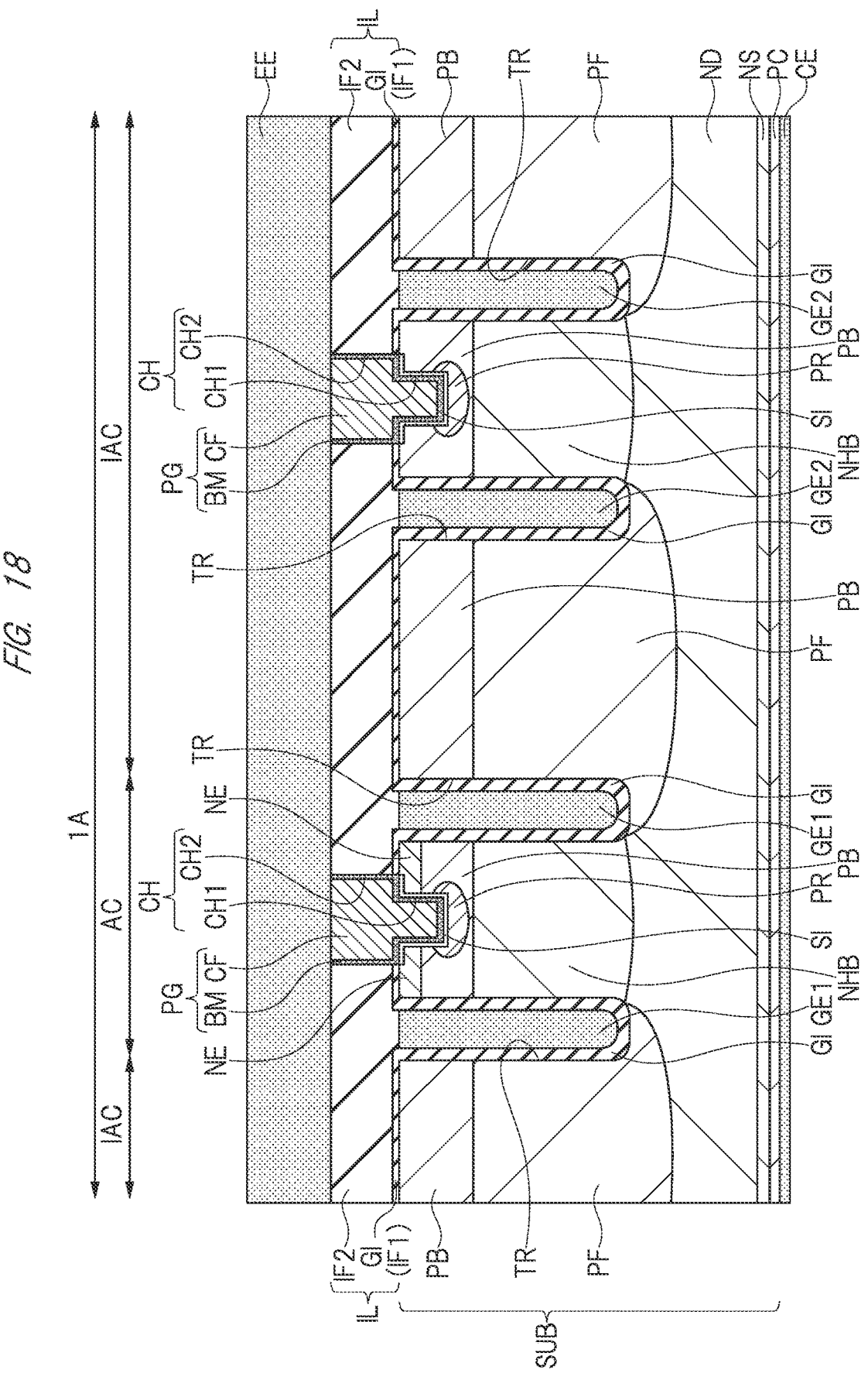
FIG. 18 is a cross-sectional view showing a semiconductor device according to the third embodiment.

As shown in FIG. 18, in the third embodiment, the insulating film IF1 is a part of the gate insulating film GI. Further, the thickness of the insulating film IF1 formed on the semiconductor layer ND outside the trenches TR is smaller than the thickness of the gate insulating film GI formed inside the trenches TR. The thickness of the insulating film IF1 is 100 to 500 angstroms (Å) also in the third embodiment.

In order to form such an insulating film IF1, the isotropic etching process is performed to the gate insulating film GI formed on the semiconductor layer ND in the step in FIG. 7. Although the gate insulating film GI is completely removed in the first embodiment, the gate insulating film GI is left by reducing the thickness thereof in the third embodiment. This left gate insulating film GI serves as the insulating film IF1.

In the third embodiment, as compared with the first embodiment, the manufacturing process can be simplified because the insulating film IF1 does not have to be re-formed. Therefore, the third embodiment is superior to the first embodiment in that the manufacturing cost can be suppressed.

On the other hand, it is difficult to adjust the thickness of the insulating film IF1 by the isotropic etching process as compared with the case where the insulating film IF1 is re-formed. Namely, the thickness of the insulating film IF1 is likely to vary. There is a fear that the variation in the thickness of the insulating film IF1 causes the variation in the implantation depth of the impurities in the subsequent ion implantation and the variation in the opening width of the second contact holes when forming the second contact holes. Therefore, the first embodiment is superior to the third embodiment in that the precision of the thickness of the insulating film IF1 can be enhanced.

Fourth Embodiment

A semiconductor device 100 according to the fourth embodiment will be described below with reference to FIG. 19. In the following, differences from the first embodiment will be mainly described, and descriptions of points overlapping with the first embodiment will be omitted.

In the first embodiment, in the step of FIG. 8, after forming the insulating film IF1, ion implantation using the insulating film IF1 as a through film is performed to form the base region PB and the emitter region NE.

Figure 19:
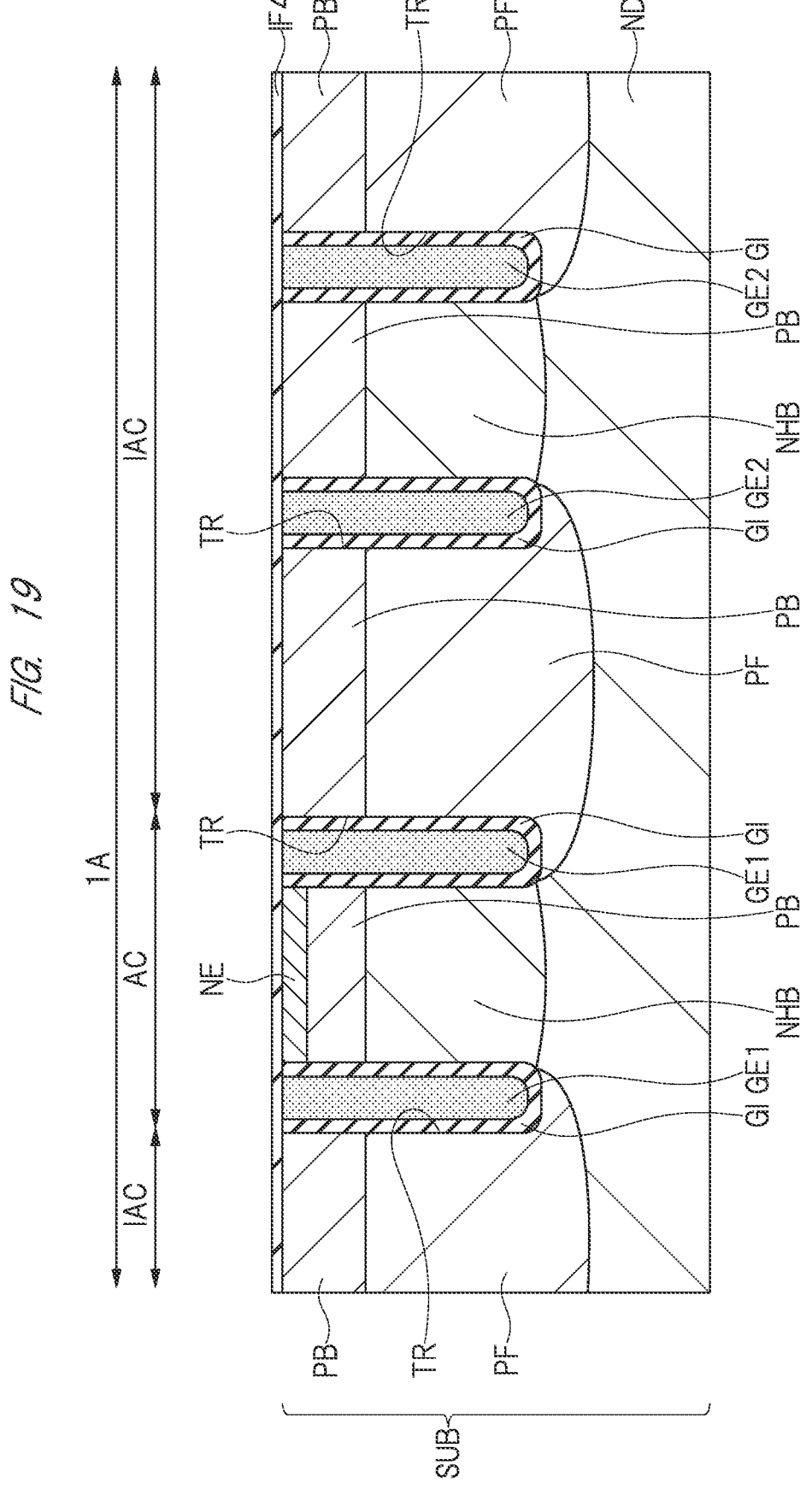
FIG. 19 is a cross-sectional view showing a manufacturing process of a semiconductor device according to the fourth embodiment.

In the fourth embodiment, as shown in FIG. 19, an insulating film IF4 made of a silicon oxide film is formed on the semiconductor layer ND by, for example, the thermal oxidation method or the CVD method before ion implantation. Next, ion implantation using the insulating film IF4 as a through film is performed. Then, after the ion implantation, the insulating film IF4 is removed by the isotropic etching process. Thereafter, the insulating film IF1 is formed on the semiconductor layer ND. The subsequent steps are the same as those in the first embodiment.

If the ion implantation using the insulating film IF1 as a through film is performed as in the first embodiment, there is a fear that the film quality of the insulating film IF1 is deteriorated and the function of preventing diffusion of phosphorus from the insulating film IF2 is degraded. Therefore, by using the insulating film IF4 different from the insulating film IF1 at the time of ion implantation as in the fourth embodiment, deterioration of the film quality of the insulating film IF1 can be prevented.

Note that the technique of the fourth embodiment can be applied also to the second embodiment.

In the foregoing, the present invention has been specifically described based on the embodiments, but it goes without saying that the present invention is not limited to the embodiments described above and can be modified in various ways within the range not departing from the gist thereof.

For example, in the above embodiments, an IGBT has been shown as an example of the device formed in the region 1A, but the technique disclosed in the above embodiments can be applied not only to the IGBT but also to a power MOSFET having a vertical trench gate.

What is claimed is:

1. A method of manufacturing a semiconductor device comprising the steps of:

(a) preparing a semiconductor substrate having a semiconductor layer of a first conductivity type;

(b) forming a trench in the semiconductor layer;

(c) forming a gate insulating film inside the trench;

(d) forming a gate electrode on the gate insulating film so as to fill an inside of the trench;

(e) forming a first insulating film on the semiconductor layer;

(f) forming a first impurity region of a second conductivity type opposite to the first conductivity type in the semiconductor layer;

(g) forming a second impurity region of the first conductivity type in the first impurity region;

(h) forming a second insulating film having a thickness larger than a thickness of the first insulating film on the first insulating film, thereby forming an interlayer insulating film including the second insulating film and the first insulating film on the semiconductor layer;

(i) forming a contact hole penetrating the interlayer insulating film and the second impurity region and reaching the first impurity region; and (j) forming a plug electrically connected to the first impurity region and the second impurity region so as to fill an inside of the contact hole, wherein the first insulating film is a silicon oxide film, wherein the second insulating film is a BPSG film, wherein the step of (i) includes:

(i1) forming a first contact hole in the second insulating film, the first insulating film, the second impurity region, and the first impurity region; and (i2) after the step of (i1), performing isotropic etching process to the second insulating film and the first insulating film, thereby forming, in the second insulating film and the first insulating film, a second contact hole having an opening width larger than an opening width of the first contact hole and communicating with the first contact hole, wherein in the step of (c), the gate insulating film is formed also on the semiconductor layer outside the trench, wherein in the step of (e), the first insulating film is formed by performing isotropic etching process to the gate insulating film formed on the semiconductor layer outside the trench, and wherein the thickness of the first insulating film formed on the semiconductor layer outside the trench is smaller than a thickness of the gate insulating film formed inside the trench.

2. The method according to claim 1, wherein the thickness of the first insulating film is equal to or smaller than half the thickness of the gate insulating film.

3. The method according to claim 1, wherein the gate insulating film is formed by thermal oxidation method.

4. The method according to claim 1, wherein, in the step of (h), the second insulating film is formed by CVD method and then heat treatment is performed to the second insulating film, and wherein an upper surface of the second insulating film after the heat treatment is more planarized than the upper surface of the second insulating film before the heat treatment.

5. The method according to claim 4, wherein, in the step of (d), in a semiconductor element formation region of the semiconductor substrate, which is different from a region where the trench is formed, a first conductive film in the same layer as the gate electrode is formed on the semiconductor layer, wherein in the step of (h), the second insulating film is formed so as to cover the first conductive film in the semiconductor element formation region, and wherein the thickness of the second insulating film formed on the first conductive film is larger than a thickness of the first conductive film before the heat treatment.

6. The method according to claim 1, wherein the step of (h) further includes forming a third insulating film having a thickness smaller than the thickness of the second insulating film and made of a PSG film on the first insulating film before forming the second insulating film, wherein the second insulating film is formed on the third insulating film, wherein the interlayer insulating film includes the first insulating film, the second insulating film, and the third insulating film, wherein in the step of (i1), the first contact hole is formed also in the third insulating film, and wherein in the step of (i2), the isotropic etching process is performed also to the third insulating film and the second contact hole is formed also in the third insulating film.

7. The method according to claim 1, wherein the step of (j) includes the steps of:

(j1) forming a barrier metal film inside the contact hole;

(j2) performing heat treatment to the barrier metal film, thereby forming a silicide film, which is an alloy film of a metal material contained in the barrier metal film and silicon, on an upper surface and a side surface of the first impurity region inside the contact hole; and (j3) forming a second conductive film on the barrier metal film so as to fill the inside of the contact hole.

* * * * *